(12) United States Patent
Kim et al.

(10) Patent No.: US 8,174,478 B2
(45) Date of Patent: May 8, 2012

(54) GATE DRIVING CIRCUIT AND DISPLAY APPARATUS HAVING THE SAME

(75) Inventors: Sung-Man Kim, Seoul (KR);
Hong-Woo Lee, Cheonan-si (KR);
Byeong-Jae Ahn, Suwon-si (KR);
Young-Geol Song, Yongin-si (KR);
Bong-Jun Lee, Jongno-gu (KR);
Yeon-Kyu Moon, Gunpo-si (KR);
Kyung-Wook Kim, Seoul (KR);
Jin-Suk Seo, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 870 days.

(21) Appl. No.: 11/760,174

(22) Filed: Jun. 8, 2007

(65) Prior Publication Data

US 2007/0296681 A1 Dec. 27, 2007

(30) Foreign Application Priority Data

Jun. 12, 2006 (KR) .................. 10-2006-0052610
Dec. 20, 2006 (KR) .................. 10-2006-0131087

(51) Int. Cl.
*G09G 3/36* (2006.01)
*G11C 19/00* (2006.01)
(52) U.S. Cl. .......................................... 345/100; 377/64
(58) Field of Classification Search ............ 345/87–104, 345/204–215, 690–699; 377/64–81
See application file for complete search history.

(56) References Cited

U.S. PATENT DOCUMENTS

| | | | |
|---|---|---|---|
| 6,774,398 B2 * | 8/2004 | Jang et al. ........................ | 257/59 |
| 2005/0275609 A1 * | 12/2005 | Lee et al. ........................ | 345/82 |
| 2006/0001637 A1 | 1/2006 | Pak et al. | |
| 2006/0017686 A1 * | 1/2006 | Park ................................ | 345/100 |
| 2006/0038500 A1 * | 2/2006 | Lee et al. ..................... | 315/169.1 |
| 2006/0056267 A1 * | 3/2006 | Kim et al. ................. | 365/230.06 |
| 2006/0061562 A1 * | 3/2006 | Park et al. ...................... | 345/204 |
| 2007/0052658 A1 * | 3/2007 | Kim ............................... | 345/100 |
| 2007/0146289 A1 * | 6/2007 | Lee et al. ....................... | 345/100 |
| 2007/0192659 A1 * | 8/2007 | Kang et al. .................... | 714/726 |
| 2008/0012816 A1 * | 1/2008 | Moon ............................ | 345/100 |

FOREIGN PATENT DOCUMENTS

| | | |
|---|---|---|
| JP | 2006-024350 | 1/2006 |
| KR | 10-2005-0103317 | 10/2005 |
| KR | 10-2005-0104895 | 11/2005 |
| KR | 10-2006-0012858 | 2/2006 |

* cited by examiner

*Primary Examiner* — Alexander Eisen
*Assistant Examiner* — Patrick F Marinelli
(74) *Attorney, Agent, or Firm* — H.C. Park & Associates, PLC

(57) ABSTRACT

A gate driving circuit and a display apparatus having the gate driving circuit include a pull-up part and a carry part pull up a present gate signal and a present carry signal, respectively, to a first clock during a first period within one frame. A pull-down part receives a next gate signal to discharge the present gate signal to a source power voltage. A pull-up driving part is connected to control terminals of the carry part and pull-up part (Q-node) to turn the carry part and pull-up part on and off. A floating preventing part prevents an output terminal of the carry part from being floated in response to the first clock during a second period within the one frame.

15 Claims, 15 Drawing Sheets

GATE DRIVING CIRCUIT AND DISPLAY APPARATUS HAVING THE SAME

CROSS-REFERENCE TO RELATED APPLICATIONS

This application claims priority from and the benefit of Korean Patent Application No. 2006-52610, filed on Jun. 12, 2006, and Korean Patent Application No. 2006-131087, filed on Dec. 20, 2006, which are hereby incorporated by reference for all purposes as if fully set forth herein.

BACKGROUND OF THE INVENTION

1. Field of the Invention

The present invention relates to a gate driving circuit and a display apparatus having the gate driving circuit. More particularly, the present invention relates to a gate driving circuit that may have improved reliability during high-temperature operations and a display apparatus having the gate driving circuit.

2. Discussion of the Background

In general, a liquid crystal display device includes a liquid crystal display panel having a lower substrate, an upper substrate facing the lower substrate, and a liquid crystal layer interposed between the lower substrate and the upper substrate in order to display an image.

The liquid crystal display panel includes a plurality of gate lines, a plurality of data lines, and a plurality of pixels connected to the gate lines and the data lines. A gate driving circuit, which provides a gate signal to gate lines, may be formed directly on the liquid crystal display panel through a thin film process.

Generally, a gate driving circuit may include a shift register in which multiple stages are connected to each other in series. Each stage includes a plurality of transistors to apply a gate voltage to a corresponding gate line of the gate lines. Specifically, each stage may include a pull-up transistor connected to a gate line to output a gate voltage and a carry transistor connected to an input terminal of the next stage to output a carry voltage that is used to control the driving of the next stage. Therefore, the gate driving circuit may prevent a distorted signal caused by a load connected to the gate line from being applied to the next stage, thereby preventing malfunction thereof.

The control terminals of the pull-up transistor and the carry transistor may be commonly connected to a Q-node in each stage. The Q-node has an electric potential of a turn-off voltage that is lower than a threshold voltage during a (n−1)H period where a gate voltage and a carry voltage are maintained at a low state. On the other hand, the Q-node has an electric potential of a turn-on voltage that is higher than the threshold voltage during a 1 H period (one horizontal scanning period) where the gate voltage and the carry voltage are maintained at a high state.

However, the electric potential of the Q-node may be floated during a predetermined period of the (n−1)H period. Thus, when the electric potential of the Q-node is not maintained at the turn-off voltage, the pull-up transistor and the carry transistor may be turned on, thereby causing a ripple of the gate voltage and the carry voltage. Particularly, when current characteristics of the pull-up transistor and the carry transistor are varied while testing a liquid crystal display panel under a high-temperature condition, a malfunction of the gate driving circuit may be caused by noise being applied through the floated Q-node, thereby deteriorating high-temperature reliability of the gate driving circuit.

SUMMARY OF THE INVENTION

The present invention provides a gate driving circuit that may be capable of improving high-temperature reliability and preventing a malfunction thereof.

The present invention also provides a display apparatus having the gate driving circuit.

Additional features of the invention will be set forth in the description which follows, and in part will be apparent from the description, or may be learned by practice of the invention.

The present invention discloses a gate driving circuit including a plurality of stages connected to each other in series. Each stage includes a pull-up part, a carry part, a pull-down part, a pull-up driving part, and a floating preventing part. The pull-up part pulls up a present gate signal to a first clock during a first period within one frame, and the carry part pulls up a present carry signal to the first clock during the first period. The pull-down part receives a next gate signal from a next stage to discharge the present gate signal to a source power voltage. The pull-up driving part is connected to a Q-node including control terminals of the carry part and the pull-up part. The pull-up driving part receives a previous carry signal from a previous stage to turn on the pull-up part and the carry part and turns off the pull-up part and the carry part in response to the next gate signal. The floating preventing part provides the present gate signal to a present carry node including an output terminal of the carry part and resets the present carry node in response to the first clock during a second period within the one frame to prevent a Q-node of the next stage from being floated. The second period does not include the first period.

The present invention also discloses a gate driving circuit including a plurality of stages connected to each other in series. Each stage includes a pull-up part, a carry part, a pull-down part, a pull-up driving part, and a floating preventing part. The pull-up part pulls up a present gate signal to a first clock during a first period within one frame, and the carry part pulls up a present carry signal to the first clock during the first period. The pull-down part receives a next gate signal from a next stage to discharge the present gate signal to a first source power voltage. The pull-up driving part is connected to a Q-node including a control terminal of the carry part and a control terminal of the pull-up part. The pull-up driving part receives a previous carry signal from a previous stage to turn on the pull-up part and the carry part and turns off the pull-up part and the carry part in response to the next gate signal. The floating preventing part provides a second source power voltage that is lower than the first source power voltage to a present carry node including an output terminal of the carry part in response to the first clock to turn down the present carry signal to the second source power voltage during a second period within the one frame. The second period does not include the first period.

The present invention also discloses a display apparatus including a display part displaying an image in response to a gate signal and a data signal, a data driving circuit applying the data signal to the display part, and a gate driving circuit including a plurality of stages connected to each other in series to sequentially output the gate signal to the display part. Each stage of the gate driving circuit includes a pull-up part, a carry part, a pull-down part, a pull-up driving part, and a floating preventing part. The pull-up part pulls up a present gate signal to a first clock during a first period within one frame, and the carry part pulls up a present carry signal to the first clock during the first period. The pull-down part receives a next gate signal from a next stage to discharge the present gate signal to a source power voltage. The pull-up part is connected to a Q-node including a control terminal of the carry part and a control terminal of the pull-up part. The pull-up driving part receives a previous carry signal from a previous stage to turn on the pull-up part and the carry part and turns off the pull-up part and the carry part in response to the next gate signal. The floating preventing part provides the present gate signal to a present carry node including an output terminal of the carry part and resets the present carry node in response to the first clock during a second period within the one frame to prevent a Q-node of the next stage from being floated. The second period does not include the first period.

The present invention also discloses a display apparatus including a display part displaying an image in response to a gate signal and a data signal, a data driving circuit applying the data signal to the display part, and a gate driving circuit including a plurality of stages connected to each other in series to sequentially output the gate signal to the display part. Each stage of the gate driving circuit includes a pull-up part, a carry part, a pull-down part, a pull-up driving part, and a floating preventing part. The pull-up part pulls up a present gate signal to a first clock during a first period within one frame, and the carry part pulls up a present carry signal to the first clock during the first period. The pull-down part receives a next gate signal from a next stage to discharge the present gate signal to a first source power voltage. The pull-up part is connected to a Q-node including a control terminal of the carry part and a control terminal of the pull-up part. The pull-up driving part receives a previous carry signal from a previous stage to turn on the pull-up part and the carry part and turns off the pull-up part and the carry part in response to the next gate signal. The floating preventing part provides a second source power voltage that is lower than the first source power voltage to a present carry node including an output terminal of the carry part and turns down the present carry signal to the second source power voltage in response to the first clock during a second period within the one frame. The second period does not include the first period.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
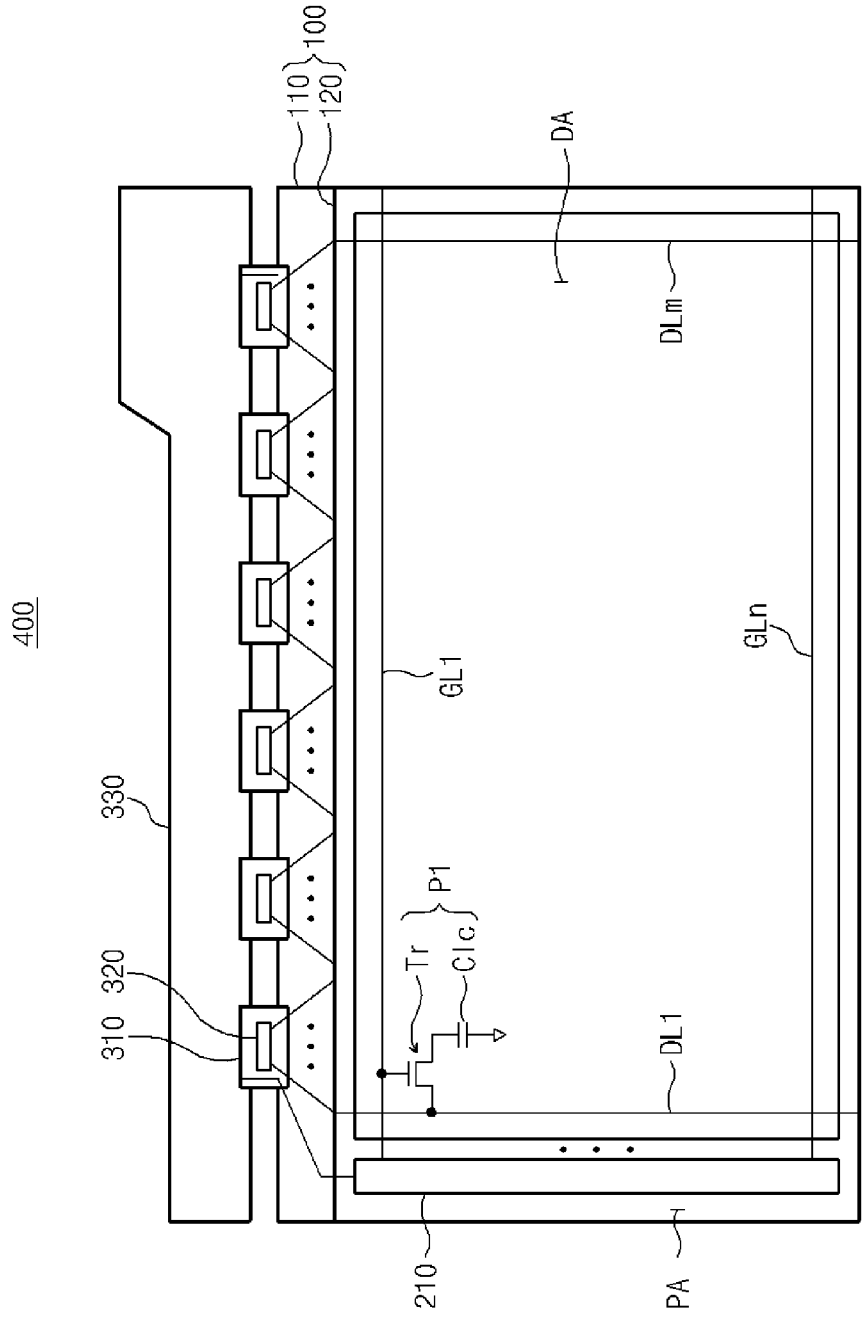
FIG. 1 is a plan view showing a liquid crystal display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on", "connected to" or "coupled to" another element or layer, it can be directly on, connected to, or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view showing a liquid crystal display device according to an exemplary embodiment of the present invention.

Referring to FIG. 1, a liquid crystal display device 400 includes a liquid crystal display panel 100 to display an image, a plurality of data driving chips 320 to output a data voltage to the liquid crystal display panel 100, and a gate driving circuit 210 to output a gate voltage to the liquid crystal display panel 100.

The liquid crystal display panel 100 includes a lower substrate 110, an upper substrate 120 facing the lower substrate 110, and a liquid crystal layer (not shown) interposed between the lower substrate 110 and the upper substrate 120. The liquid crystal display panel 100 is divided into a display area DA, on which an image is displayed, and a peripheral area PA, which is adjacent to the display area DA.

A plurality of pixel areas are defined in a matrix in the display area DA by a plurality of gate lines GL1~GLn and a plurality of data lines DL1~DLm, which cross and are insulated from the gate lines GL1~GLn. Each pixel area includes a pixel P1 having a thin film transistor Tr and a liquid crystal capacitor Clc. The thin film transistor Tr includes a gate electrode connected to a first gate line GL1, a source electrode connected to a first data line DL1, and a drain electrode connected to a pixel electrode, which serves as a first electrode of the liquid crystal capacitor Clc.

The gate driving circuit 210 is arranged in the peripheral area PA and adjacent to one end of the gate lines GL1~GLn. The gate driving circuit 210 is connected to the gate lines GL1~GLn, and it sequentially applies the gate voltage to the gate lines GL1~GLn.

A plurality of tape carrier packages (TCPs) 310 is arranged in the peripheral area PA and adjacent to one end of the data lines DL1~DLm. The data driving chips 320 are mounted on the TCPs 310, respectively. The data driving chips 320 are connected to the data lines DL1~DLm and output data voltages to the data lines DL1~DLm.

The liquid crystal display device 400 further includes a printed circuit board 330 to control the driving of the gate driving circuit 210 and the data driving chips 320. The printed circuit board 330 outputs a data control signal and image data for the data driving chips 320 and outputs a gate control signal for the gate driving circuit 210. The data control signal and the image data are applied to the data driving chips 320 through the TCPs 310. The gate control signal is applied to the gate driving circuit 210 through the TCP 310 that is closest to the gate driving circuit 210.

The gate driving circuit 210 will be described in detail below with reference to FIG. 2, FIG. 3, FIG. 4, FIG. 5, and FIG. 6.

Figure 2:
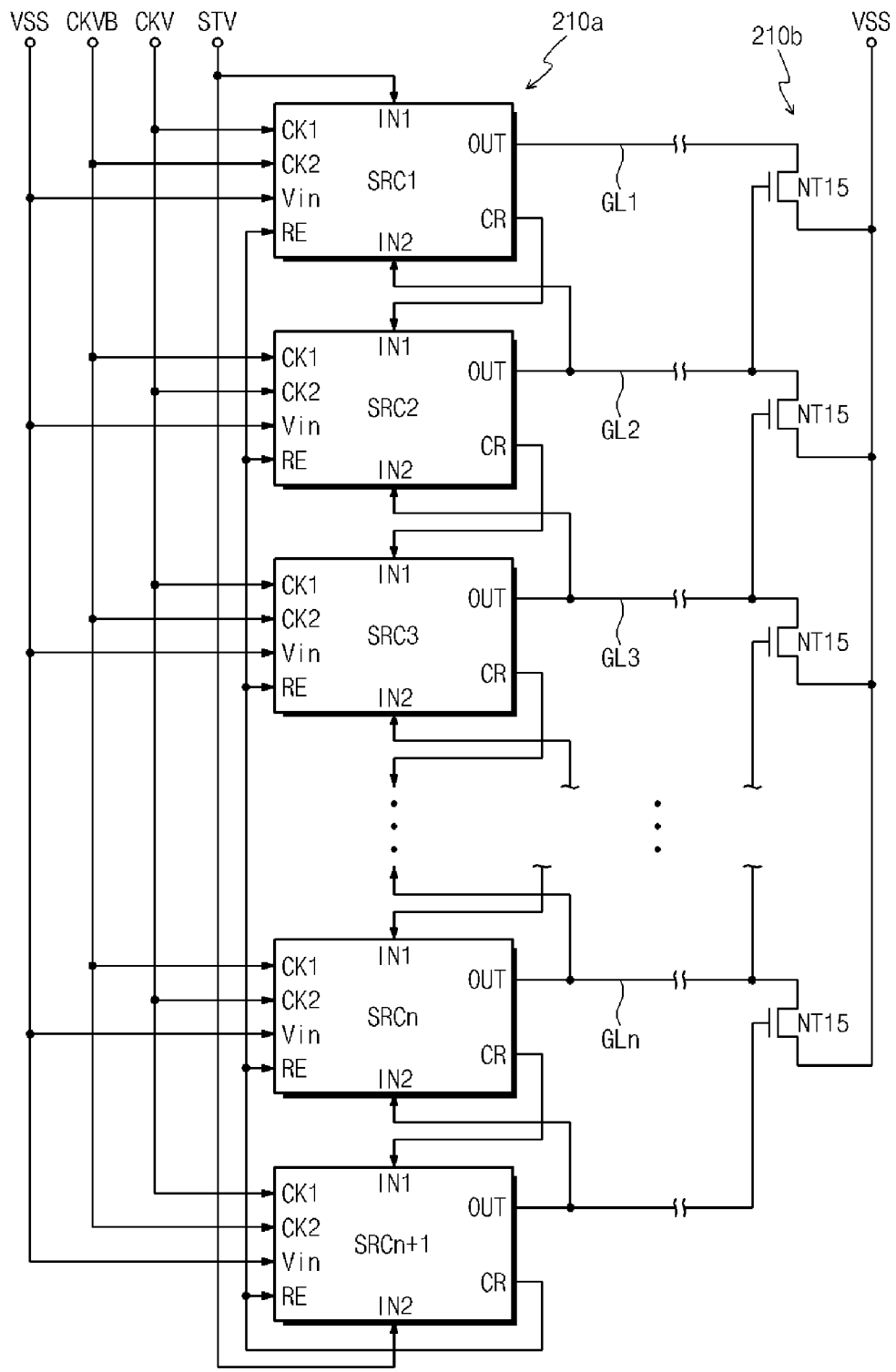
FIG. 2 is a block diagram showing a gate driving circuit of FIG. 1.

FIG. 2 is a block diagram showing the gate driving circuit of FIG. 1.

Referring to FIG. 2, the gate driving circuit 210 includes a shift register 210a having a plurality of stages SRC1~SRCn+1 connected to each other in series. Each stage includes a first input terminal IN1, a first clock terminal CK1, a second clock terminal CK2, a second input terminal IN2, a voltage input terminal Vin, a reset terminal RE, an output terminal OUT, and a carry terminal CR.

The first input terminal IN1 of stages SRC2~SRCn+1 is connected to the carry terminal CR of a previous stage to receive a previous carry voltage. The first input terminal IN1 of the first stage SRC1 receives a start signal STV, which starts the driving of the gate driving circuit 210. The second input terminal IN2 of stages SRC1~SRCn is connected to the output terminal OUT of a next stage to receive a next gate voltage. The second input terminal IN2 of the last stage SRCn+1 receives the start signal STV.

The first clock terminal CK1 and the second clock terminal CK2 of the odd-numbered stages SRC1, SRC3, ..., SRCn+1 receive a first clock CKV and a second clock CKVB, respectively. On the contrary, the first clock terminal CK1 and the second clock terminal CK2 of the even-numbered stages SRC2, ..., SRCn receive the second clock CKVB and the first clock CKV, respectively. The first clock CKV and the second clock CKVB have opposite phases from each other.

The voltage input terminal Vin of the stages SRC1~SRCn+1 receives a source power voltage VSS. Also, the carry terminal CR of the last stage SRCn+1 is connected to the reset terminal RE of the stages SRC1~SRCn+1.

The output terminals OUT of the stages SRC1~SRCn are connected to the gate lines GL1~GLn, respectively. Therefore, the stages SRC1~SRCn may sequentially output the gate voltage through the output terminals OUT to apply the gate voltage to the gate lines GL1~GLn.

As shown in FIG. 1 and FIG. 2, the shift register 210a is arranged adjacent to a first end of the gate lines GL1~GLn. The gate driving circuit 210 may further include a discharge circuit 210b that is arranged adjacent to a second end of the gate lines GL1~GLn. The discharge circuit 210b discharges a present gate line to the source power voltage VSS in response to the next gate voltage output from the next stage. The discharge circuit 210b includes a discharge transistor NT15 for each gate line GL1~GLn, and each discharge transistor NT15 includes a control electrode connected to a next gate line, an input electrode to which the source power voltage VSS is applied, and an output electrode connected to the present gate line.

Figure 3:
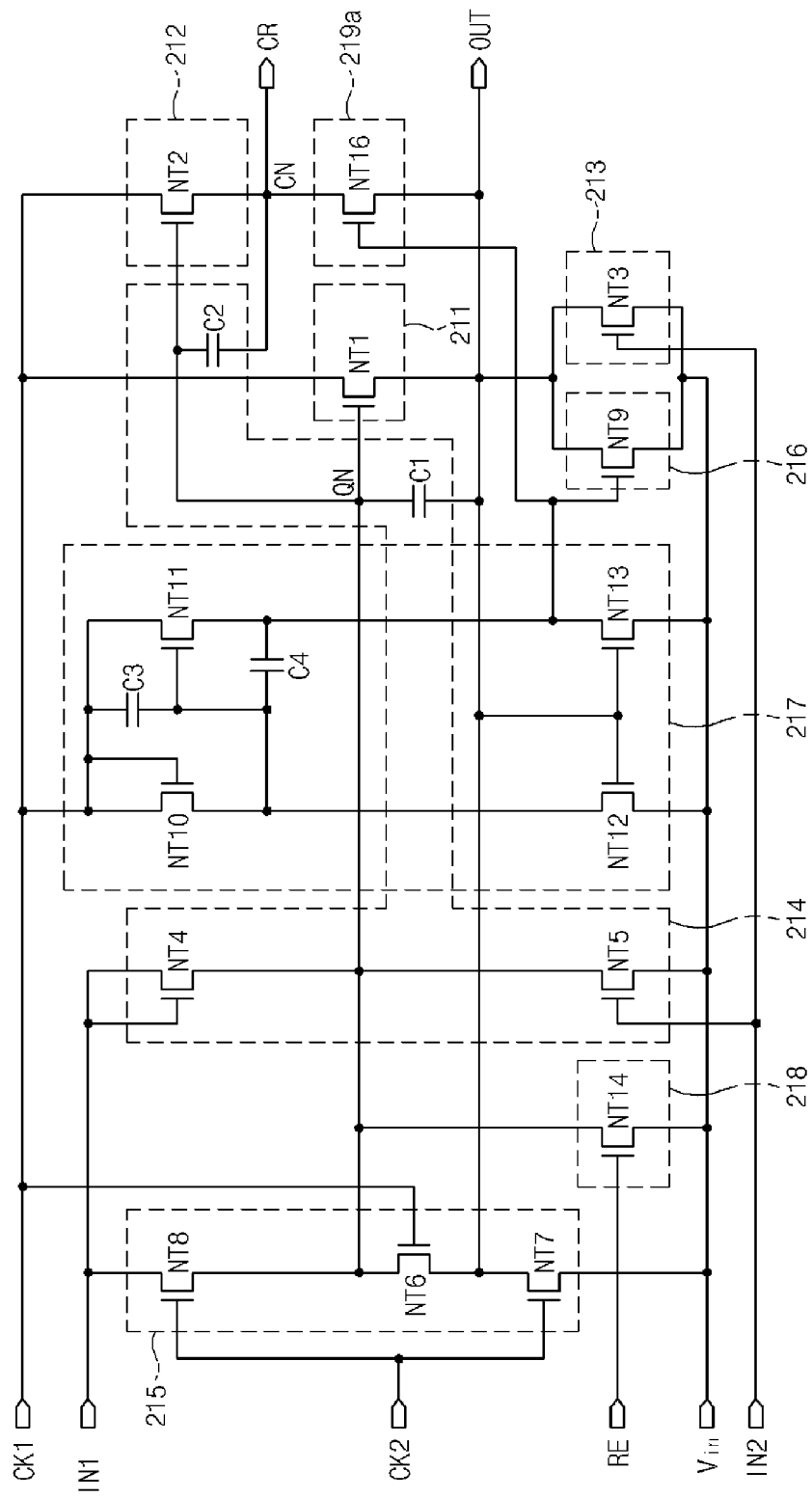
FIG. 3 is a circuit diagram of each stage of FIG. 2 according to an exemplary embodiment of the present invention.

FIG. 3 is a circuit diagram of each stage of FIG. 2 according to an exemplary embodiment of the present invention. In FIG. 2, since each stage of the gate driving circuit 210 has the same configuration, only one stage will be described in detail with reference to FIG. 3 and detailed descriptions of the other stages will be omitted to avoid redundancy.

Referring to FIG. 3, each stage includes a pull-up part 211, a carry part 212, a pull-down part 213, a pull-up driving part 214, a ripple preventing part 215, a holding part 216, an inverter 217, a reset part 218, and a first floating preventing part 219a.

The pull-up part 211 includes a pull-up transistor NT1 having a control electrode connected to an output terminal QN of the pull-up driving part 214 (Q-node QN), an input electrode connected to the first clock terminal CK1, and an output electrode connected to the output terminal OUT. Thus, responsive to a control voltage output from the pull-up driving part 214, the pull-up transistor NT1 pulls up a present gate voltage output through the output terminal OUT to a clock (hereinafter, referred to as first clock CKV shown in FIG. 2) applied through the first clock terminal CK1. The pull-up transistor NT1 is turned on only during a first period, which is one horizontal scanning period (1 H period) where the first clock CKV is maintained at a high state within one frame, thereby maintaining the present gate voltage at the high state during the first period. Thus, the present gate line is turned on during the first period.

The carry part 212 includes a carry transistor NT2 having a control electrode connected to the Q-node QN, an input electrode connected to the first clock terminal CK1, and an output electrode connected to the carry terminal CR. The carry transistor NT2 pulls up a present carry voltage output through the carry terminal CR to the first clock CKV in response to the control voltage output from the pull-up driving part 214. The carry transistor NT2 is turned on only during the first period within one frame to maintain the present carry voltage at the high state during the first period.

The pull-down part 213 includes a pull-down transistor NT3 having a control electrode connected to the second input terminal IN2, an input electrode connected to the voltage input terminal Vin, and an output electrode connected to the output terminal OUT. Responsive to the next gate voltage from the next stage, the pull-down transistor NT3 pulls down the present gate voltage, which is at the first clock CKV, to the source power voltage VSS (shown in FIG. 2) that is supplied through the voltage input terminal Vin. That is, the pull-down transistor NT3 is turned on after the first period, and it pulls down the present gate voltage to low state.

The pull-up driving part 214 includes a buffer transistor NT4, a first capacitor C1, a second capacitor C2, and a discharge transistor NT5. The buffer transistor NT4 includes an input electrode and a control electrode commonly connected to the first input terminal IN1 and an output electrode connected to the Q-node QN. The first capacitor C1 is connected between the Q-node QN and the output terminal OUT, and the second capacitor C2 is connected between the control electrode of the carry transistor NT2 and the carry terminal CR. The discharge transistor NT5 includes an input electrode connected to the output electrode of the buffer transistor NT4, a control electrode connected to the second input terminal IN2, and an output electrode connected to the voltage input terminal Vin.

When the buffer transistor NT4 is turned on in response to the previous carry voltage from the previous stage, the first capacitor C1 and the second capacitor C2 are charged. When a charge, which is higher than a threshold voltage of the pull-up transistor NT1, is charged in the first capacitor C1, an electric potential of the Q-node QN increases higher than the threshold voltage, so that the pull-up transistor NT1 and the carry transistor NT2 are turned on. Thus, the first clock CKV is output through the output terminal OUT and the carry terminal CR, thereby transiting the present gate voltage and the present carry voltage to a high state. Thus, the present gate voltage and the present carry voltage are maintained at a high state during the high period of the first clock CKV.

Then, when the discharge transistor NT5 is turned on in response to the next gate voltage from the next stage, the charge that is charged in the first capacitor C1 is discharged to the source power voltage VSS through the discharge transistor NT5. Thus, the electric potential of the Q-node QN is lowered to the source power voltage VSS, so that the pull-up transistor NT1 and the carry transistor NT2 are turned off. That is, since the discharge transistor NT5 is turned on after the first period to turn off the pull-up transistor NT1 and the carry transistor NT2, the discharge transistor NT5 may prevent output of the present gate voltage and the present carry voltage at the high state through the output terminal OUT and the carry terminal CR.

The ripple preventing part 215 includes a first ripple preventing transistor NT6, a second ripple preventing transistor NT7, and a third ripple preventing transistor NT8. The ripple preventing part 215 may prevent the present gate voltage and the present carry voltage from being rippled by the first clock CKV or the second clock CKVB during a remaining second period (that is, a (n−1)H period) except the first period within one frame.

The first ripple preventing transistor NT6 includes a control electrode connected to the first clock terminal CK1, an input electrode connected to the output terminal OUT, and an output electrode connected to the Q-node QN. The second ripple preventing transistor NT7 includes a control electrode connected to the second clock terminal CK2, an input electrode connected to the output terminal OUT, and an output electrode connected to the voltage input terminal Vin. The third ripple preventing transistor NT8 includes a control electrode connected to the second clock terminal CK2, an input electrode connected to the first input terminal IN1, and an output electrode connected to the Q-node QN.

The first ripple preventing transistor NT6 provides the present gate voltage (that has a same voltage level as an off-voltage) output from the output terminal OUT to the Q-node QN in response to the first clock CKV during the second period. Thus, the electric potential of the Q-node QN is maintained at the source power voltage VSS during the high period of the first clock CKV within the second period. Consequently, the first ripple preventing transistor NT6 prevents the pull-up transistor NT1 and the carry transistor NT2 from being turned on during the high period of the first clock CKV within the second period.

The second ripple preventing transistor NT7 discharges the present gate voltage to the source power voltage VSS in response to the second clock CKVB. Thus, the second ripple preventing transistor NT7 maintains the present gate voltage at the source power voltage VSS during the high period of the second clock CKVB within the second period.

The third ripple preventing transistor NT8 provides the previous carry voltage from the previous stage (that has a same voltage level as the source power voltage VSS) input through the first input terminal IN1 to the Q-node QN in response to the clock (hereinafter, referred to as second clock CKVB, shown in FIG. 2) provided through the second clock terminal CK2. Thus, the electric potential of the Q-node QN is maintained at the source power voltage VSS during the high period of the second clock CKVB within the second period. As a result, the third ripple preventing transistor NT8 prevents the pull-up transistor NT1 and the carry transistor NT2 from being turned on during the high period of the second clock CKVB within the second period.

The process that the previous carry voltage is maintained at the same voltage level as that of the source power voltage VSS will be described below with the first floating preventing part 219a.

The holding part 216 includes a holding transistor NT9 having a control electrode connected to the output terminal of the inverter 217, an input electrode connected to the voltage input terminal Vin, and an output electrode connected to the output terminal OUT.

The inverter 217 includes a first inverter transistor NT10, a second inverter transistor NT11, a third inverter transistor NT12, a fourth inverter transistor NT13, a third capacitor C3, and a fourth capacitor C4 in order to turn the holding transistor NT9 on and off.

The first inverter transistor NT10 includes an input electrode and a control electrode commonly connected to the first clock terminal CK1 and an output electrode connected to the output electrode of the second inverter transistor NT11 through the fourth capacitor C4. The second inverter transistor NT11 includes an input electrode connected to the first clock terminal CK1, a control electrode connected to the input electrode thereof through the third capacitor C3, and an output electrode connected to the control electrode of the holding transistor NT9. The third inverter transistor NT12 includes an input electrode connected to the output electrode of the first inverter transistor NT10, a control electrode connected to the output terminal OUT, and an output electrode connected to the voltage input terminal Vin. The fourth inverter transistor NT13 includes an input electrode connected to the control electrode of the holding transistor NT9, a control electrode connected to the output terminal OUT, and an output electrode connected to the voltage input terminal Vin.

The third inverter transistor NT12 and the fourth inverter transistor NT13 are turned on in response to the present gate voltage that is maintained at the high state and output to the output terminal OUT, and the first clock CKV output from the first inverter transistor NT10 and the second inverter transistor NT11 is discharged to the source power voltage VSS. Thus, the holding transistor NT9 is turned off during the first period where the present gate voltage is maintained at the high state. When the present gate voltage transitions to the low state, the third inverter transistor NT12 and the fourth inverter transistor NT13 are turned off. Accordingly, responsive to the first clock CKV output from the first and the second inverter transistors NT10 and NT11, the holding transistor NT9 is turned on. As a result, the holding transistor NT9 holds the present gate voltage at the level of the source power voltage VSS during the high period of the first clock CKV within the second period.

The reset part 218 includes a reset transistor NT14 having a control electrode connected to the reset terminal RE, an input electrode connected to the control electrode of the pull-up transistor NT1, and an output electrode connected to the voltage input terminal Vin. The reset transistor NT14 discharges noise input through the first input terminal IN1 to the source power voltage VSS in response to a last carry voltage from the last stage SRCn+1 (shown in FIG. 2) that is input through the reset terminal RE. Thus, the pull-up transistor NT1 and the carry transistor NT2 are turned off in response to the last carry voltage from the last stage SRCn+1. As a result, the last carry voltage is provided to the reset terminal RE of all n stages to turn off the pull-up transistor NT1 and the carry transistor NT2 of each stage, thereby resetting all stages.

The first floating preventing part 219a includes a first floating preventing transistor NT16 having a control electrode connected to the output terminal of the inverter 217, an input electrode connected to the output terminal OUT, and an output electrode connected to a present carry node CN. The first floating preventing transistor NT16 is turned on or turned off in response to an output signal of the inverter 217. Specifically, the first floating preventing transistor NT16 is turned off during the first period in response to the low output signal of the inverter 217. Then, the first floating preventing transistor NT16 is turned on during the high period of the first clock CKV within the second period in response to the high output signal of the inverter 217. The turned-on first floating preventing transistor NT16 outputs the present gate voltage that is maintained at the low state during the second period to the present carry node CN. Thus, the first floating preventing transistor NT16 resets the present carry node CN to the source power voltage VSS during the high period of the first clock CKV within the second period.

As shown in FIG. 2, the present carry node CN (i.e. the carry terminal CR) is connected to the first input terminal IN1 of the next stage. Thus, the carry voltage that has a same voltage level as the source power voltage VSS is applied to the first input terminal IN1 of the next stage during the high period of the first clock CKV within the second period. As a result, an electric potential of the Q-node of the next stage may be maintained at the source power voltage VSS during the high period of the first clock CKV within the second period. Consequently, the first floating preventing transistor NT16 of the present stage may prevent the Q-node of the next stage from being floated.

Figure 4:
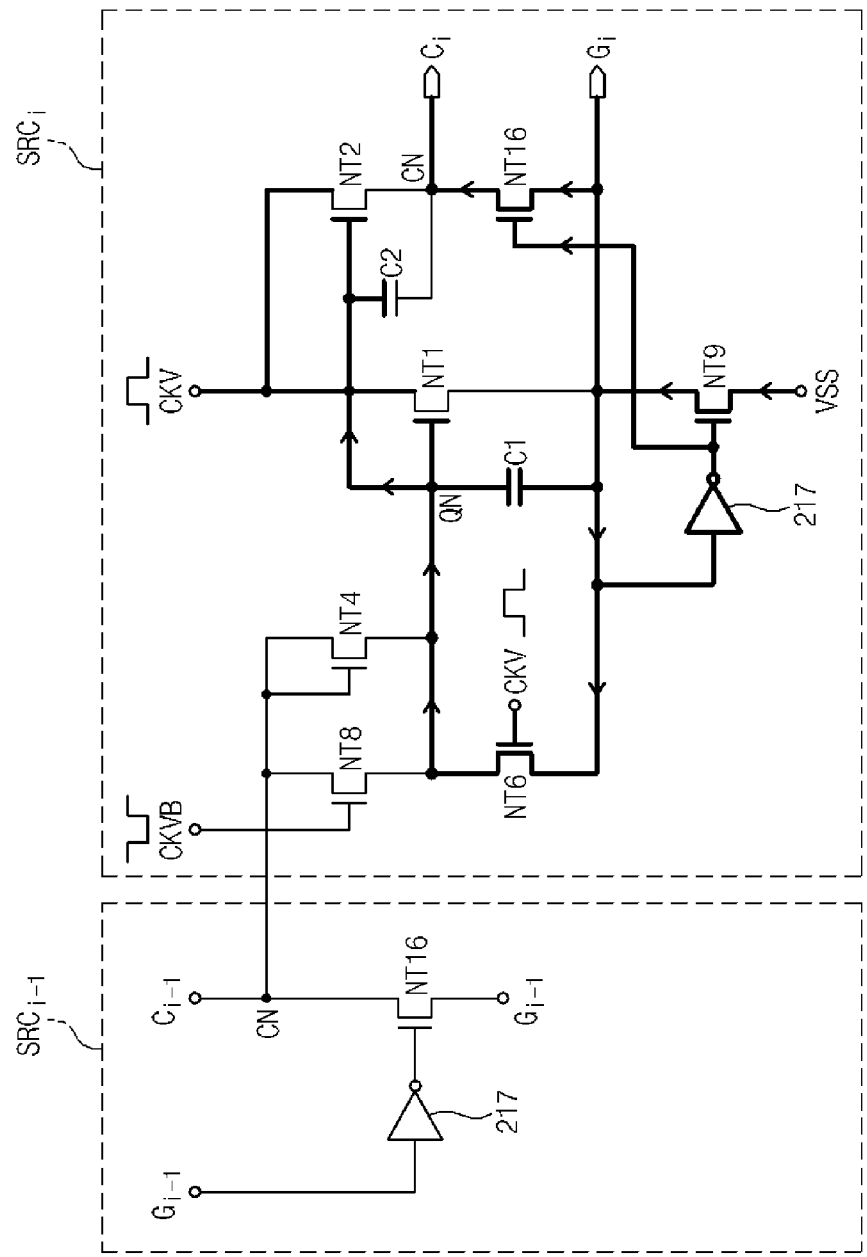
FIG. 4 is a circuit diagram showing an electric potential of a Q-node during a high period of a first clock.
Figure 5:
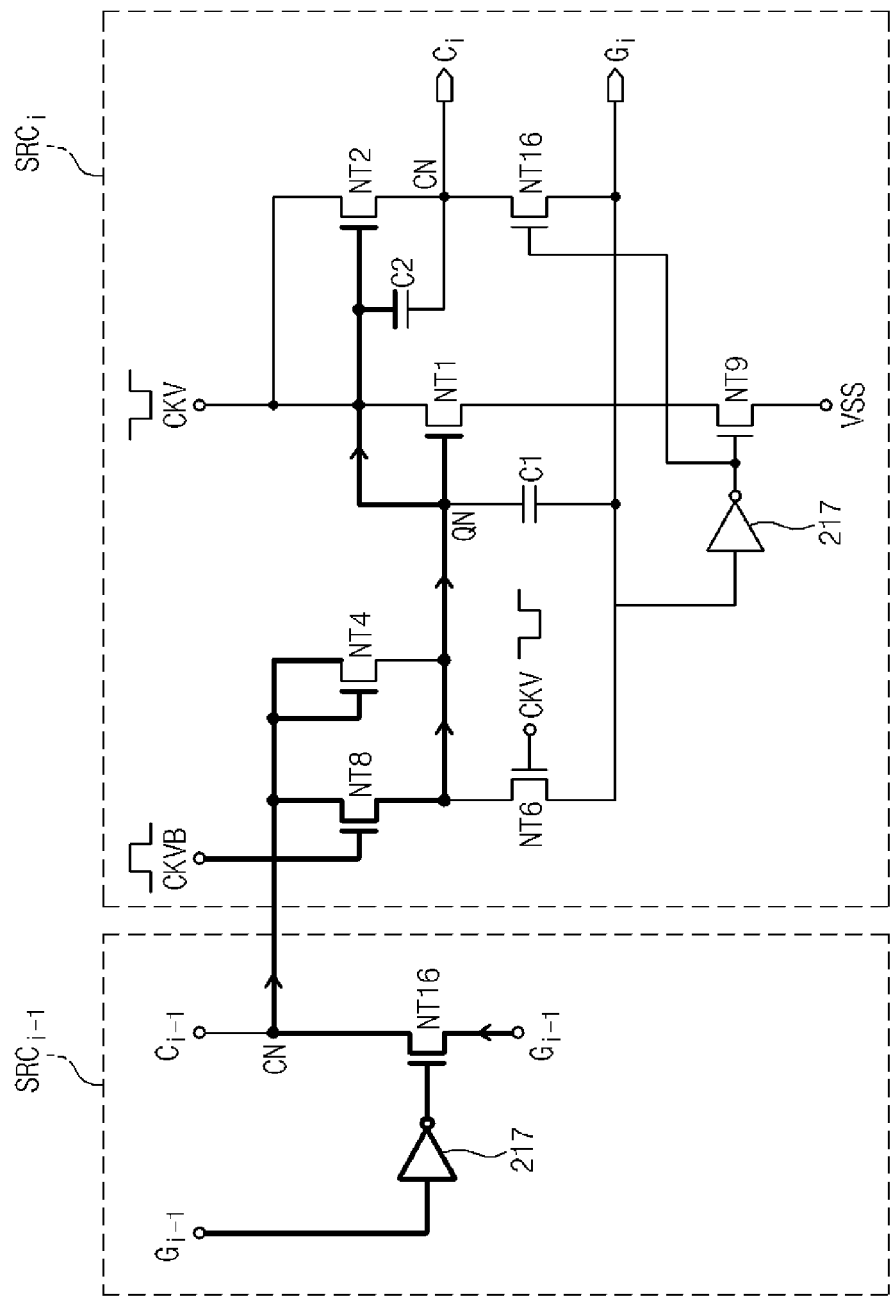
FIG. 5 is a circuit diagram showing an electric potential of the Q-node during a high period of a second clock.

FIG. 4 is a circuit diagram showing the electric potential of the Q-node during the high period of the first clock CKV within the second period, and FIG. 5 is a circuit diagram showing the electric potential of the Q-node during the high period of the second clock CKVB within the second period. In FIG. 4 and FIG. 5, a circuit of an i-th stage among the stages of the shift register ("i" is an odd number that is larger than 1 and smaller than n) will be partially shown.

Referring to FIG. 4, the holding transistor NT9 and the first ripple preventing transistor NT6 are turned on in order to hold the electric potential of the Q-node QN at the source power voltage VSS during the high period of the first clock CKV within the second period where an i-th gate voltage Gi is maintained at the low state (e.g., the level of the source power voltage VSS).

Specifically, the inverter 217 outputs a high output signal in response to the first clock CKV to turn the holding transistor NT9 on to output the source power voltage VSS. Since the first ripple preventing transistor NT6 is previously turned on in response to the first clock CKV, the source power voltage VSS output from the holding transistor NT9 is applied to the Q-node QN through the first ripple preventing transistor NT6. Thus, the electric potential of the Q-node QN is maintained at the source power voltage VSS, and the pull-up transistor NT1 and the carry transistor NT2 connected to the Q-node QN are turned off. Consequently, the i-th gate voltage Gi and an i-th carry voltage Ci may be prevented from being rippled during the high period of the first clock CKV within the second period.

The source power voltage VSS output from the holding transistor NT9 is also output to the output terminal OUT of the i-th stage SRCi, so that the i-th gate voltage Gi is maintained at the source power voltage VSS.

The first floating preventing transistor NT16 is turned on in response to the high output signal from the inverter 217, thereby maintaining the electric potential of the carry node CN of the i-th stage SRCi at the source power voltage VSS. The i-th carry voltage Ci having the level of the source power voltage VSS is output from the i-th stage SRCi and applied to the first input terminal IN1 of an (i+1)th stage (not shown).

Referring to FIG. 5, the third ripple preventing transistor NT8 is turned on in order to hold the electric potential of the Q-node QN at the source power voltage VSS during the high period of the second clock CKVB within the second period where the i-th gate voltage Gi is maintained at the low state (e.g., the level of the source power voltage VSS).

The input electrode of the third ripple preventing transistor NT8 of the i-th stage SRCi is connected to the carry node CN of the (i−1)th stage SRCi−1, and the carry node CN of the (i−1)th stage SRCi−1 is maintained at the source power voltage VSS by the first floating preventing transistor NT16 of the (i−1)th stage SRCi−1 because the (i−1)th gate voltage Gi−1 has the level of the source power voltage VSS. Thus, the (i−1)th carry voltage Ci−1 having the level of the source power voltage VSS is applied to the input electrode of the third ripple preventing transistor NT8 of the i-th stage SRCi. The (i−1)th carry voltage Ci−1 is applied to the Q-node QN of the i-th stage SRCi through the third ripple preventing transistor NT8.

Consequently, the electric potential of the Q-node QN in the i-th stage SRCi is maintained at the level of the source power voltage VSS, and the pull-up transistor NT1 and the carry transistor NT2 connected to the Q-node QN are turned off. Thus, the ripple of the i-th gate voltage Gi and the i-th carry voltage Ci may be prevented during the high period of the second clock CKVB within the second period.

Figure 6:
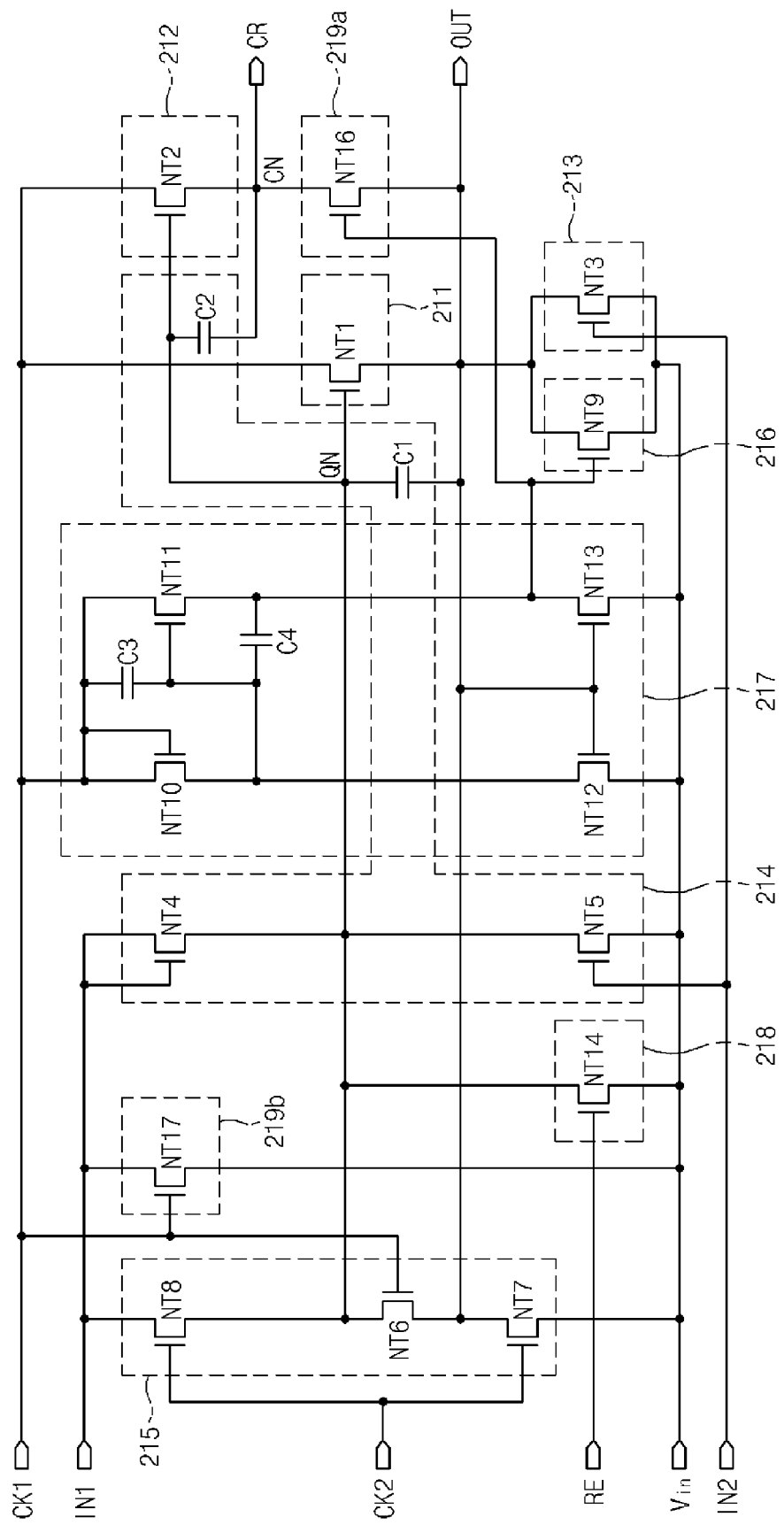
FIG. 6 is a circuit diagram showing each stage of a gate driving circuit according to another exemplary embodiment of the present invention.

FIG. 6 is a circuit diagram showing each stage of a gate driving circuit according to another exemplary embodiment of the present invention. In FIG. 6, the same reference numerals denote the same elements as in FIG. 3, and thus the detailed description of the same elements will be omitted.

Referring to FIG. 6, each stage includes a pull-up part 211, a carry part 212, a pull-down part 213, a pull-up driving part 214, a ripple preventing part 215, a holding part 216, an inverter 217, a reset part 218, a first floating preventing part 219a, and a second floating preventing part 219b.

The second floating preventing part 219b includes a second floating preventing transistor NT17 having a control electrode connected to a first clock terminal CK1, an input electrode connected to a voltage input terminal Vin, and an output electrode connected to a first input terminal IN1.

The second floating preventing transistor NT17 is turned on in response to a first clock CKV (shown in FIG. 2) during a high period of the first clock CKV input to the first clock terminal CK1 within the second period where a present gate voltage is maintained at a low state. Thus, the second floating preventing transistor NT17 provides a source power voltage VSS applied to the voltage input terminal Vin to the first input terminal IN1. In the present exemplary embodiment, the first input terminal IN1 is connected to a carry node CN (i.e. a carry terminal CR) of the previous stage.

Therefore, the second floating preventing transistor NT17 applies the source power voltage VSS to the carry node CN of the previous stage to reset the previous carry node CN during the high period of the first clock CKV within the second period. Thus, the second floating preventing transistor NT17 prevents the previous carry node CN from being floated.

Figure 7:
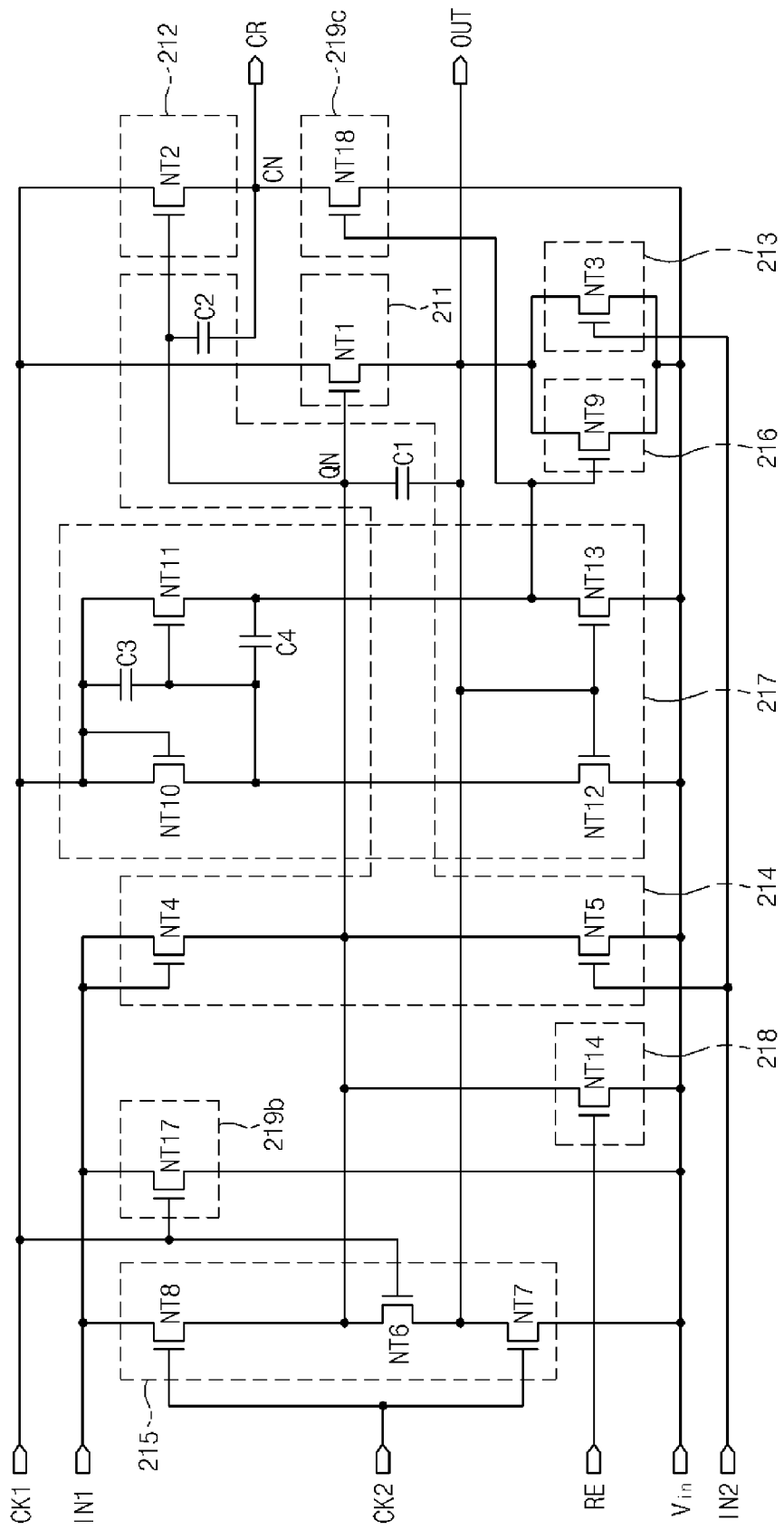
FIG. 7 is a circuit diagram showing each stage of a gate driving circuit according to another exemplary embodiment of the present invention.

FIG. 7 is a circuit diagram showing each stage of a gate driving circuit according to another exemplary embodiment of the present invention. In FIG. 7, the same reference numerals denote the same elements as in FIG. 6, and thus the detailed description of the same elements will be omitted.

Referring to FIG. 7, each stage includes a pull-up part 211, a carry part 212, a pull-down part 213, a pull-up driving part 214, a ripple preventing part 215, a holding part 216, an inverter 217, a reset part 218, a second floating preventing part 219b, and a third floating preventing part 219c.

The third floating preventing part 219c includes a third floating preventing transistor NT18 having a control electrode connected to an output terminal of the inverter 217, an input electrode connected to a voltage input terminal Vin, and an output electrode connected to a present carry node CN. The third floating preventing transistor is turned on or turned off in response to an output signal of the inverter 217.

Specifically, the third floating preventing transistor NT18 is turned off in response to the low output signal of the inverter 217 during a first period within one frame. Then, the third floating preventing transistor NT18 is turned on in response to the high output signal of the inverter 217 during a high period of a first clock CKV among a second period except the first period within the frame. The turned-on third floating preventing transistor NT18 outputs a source power voltage VSS (shown in FIG. 2) input to the voltage input terminal Vin to the present carry node CN. Thus, the third floating preventing transistor NT18 resets an electric potential of the present carry node CN to the level of the source power voltage VSS during the high period of the first clock CKV within the second period.

Figure 8:
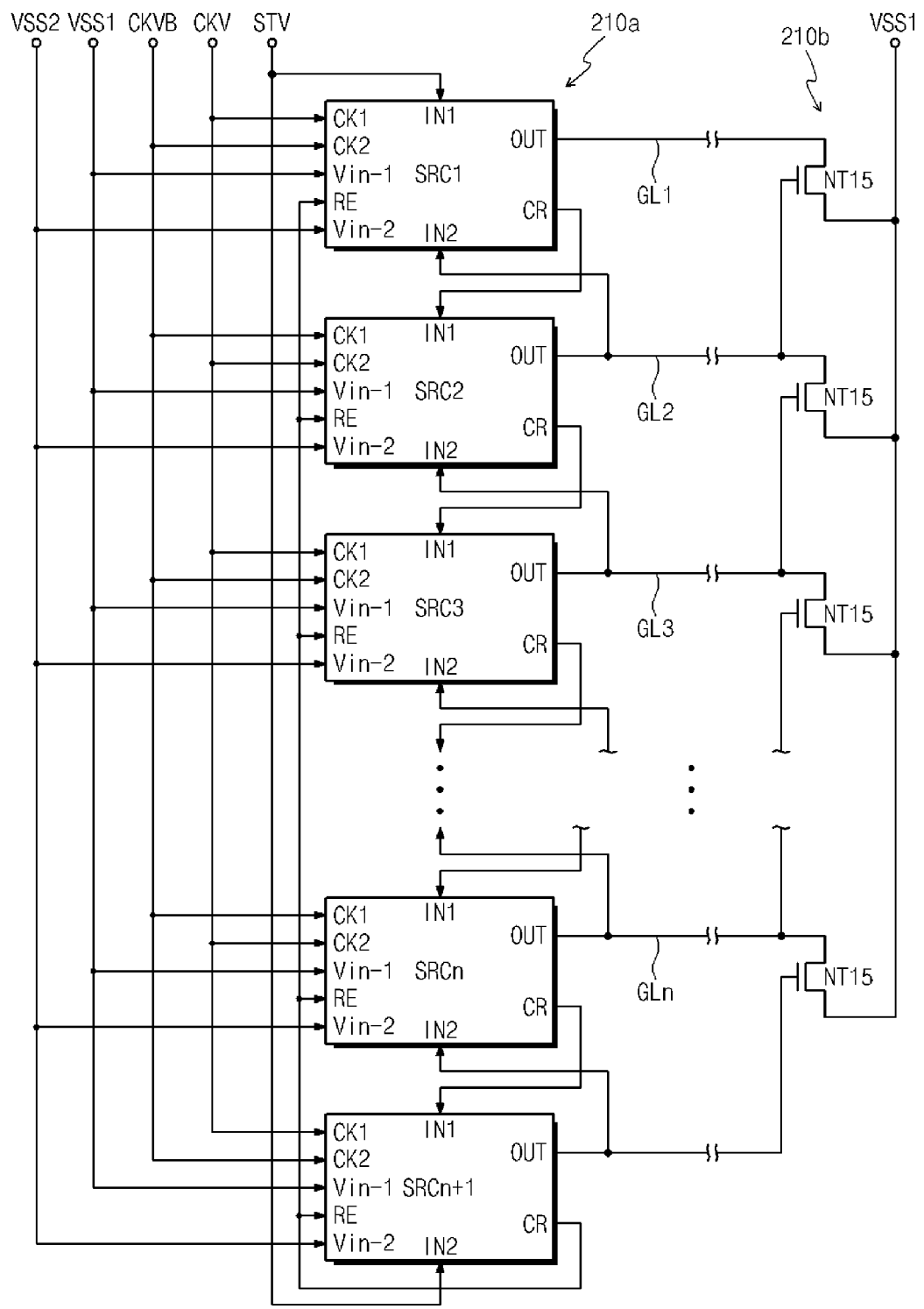
FIG. 8 is a block diagram showing a gate driving circuit according to another exemplary embodiment of the present invention.

FIG. 8 is a block diagram showing a gate driving circuit according to another exemplary embodiment of the present invention. In FIG. 8, the same reference numerals denote the same elements as in FIG. 2, and thus the detailed description of the same elements will be omitted.

Referring to FIG. 8, the gate driving circuit 210 includes a shift register 210a having a plurality of stages SRC1~SRCn+1 connected to each other in series. The shift register 210a is arranged adjacent to first ends of the gate lines GL1~GLn. Each stage includes a first input terminal IN1, a first clock terminal CK1, a second clock terminal CK2, a second input terminal IN2, a first voltage input terminal Vin−1, a reset terminal RE, a second voltage input terminal Vin−2, an output terminal OUT, and a carry terminal CR.

A first source power voltage VSS1 is provided to the first voltage input terminal Vin−1 of the stages SRC1~SRCn+1. The first source power voltage VSS1 may be a ground level voltage or a negative voltage. A second source power voltage VSS2, which is lower than the first source power voltage VSS1, is applied to the second voltage input terminal Vin−2. In the present exemplary embodiment, the first source power voltage VSS1 is about −6.7V, and the second source power voltage VSS2 is about −13V.

Figure 9:
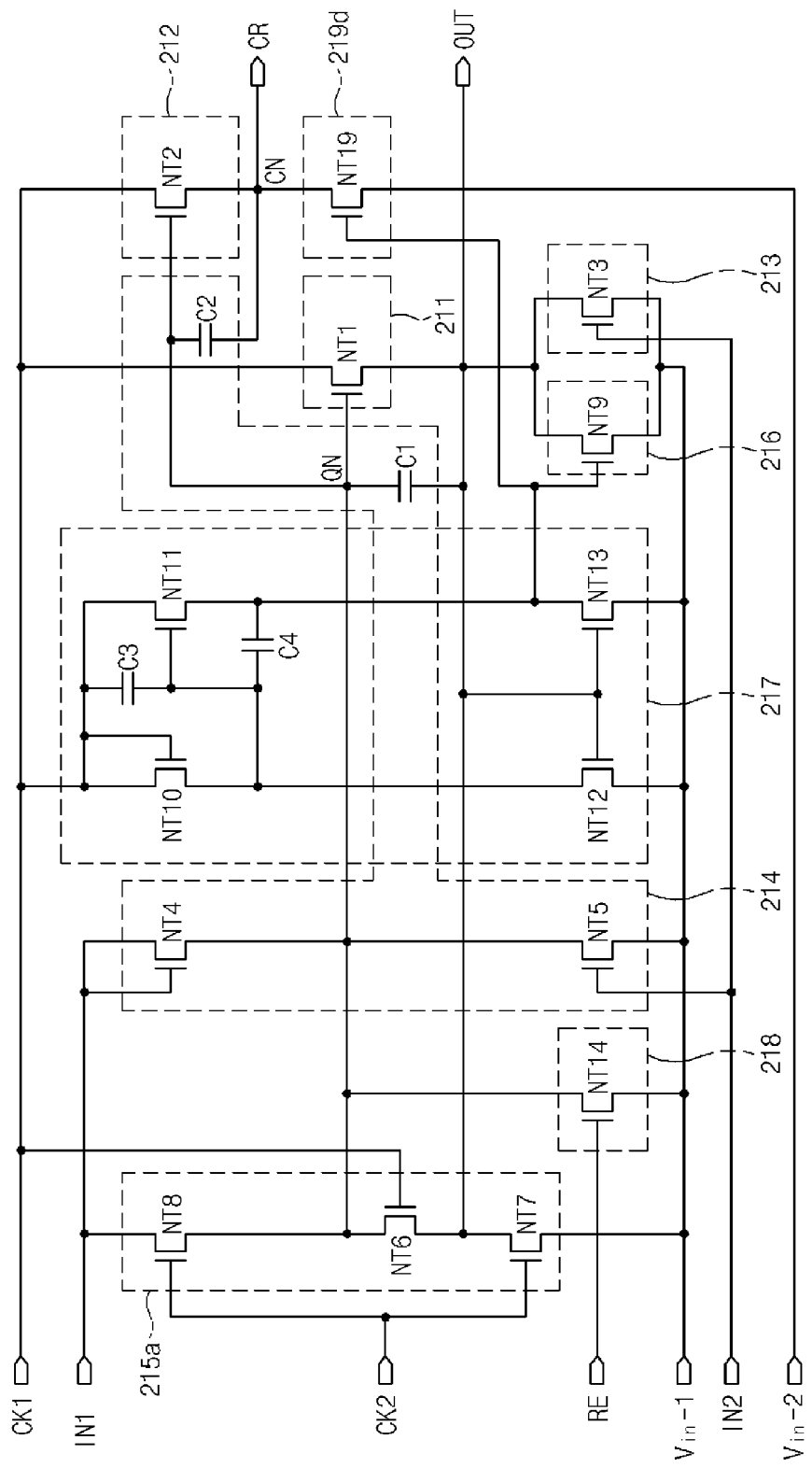
FIG. 9 is a circuit diagram showing each stage of FIG. 8.

FIG. 9 is a circuit diagram showing each stage of FIG. 8. In FIG. 8, since each stage of the gate driving circuit has the same configuration, only one stage will be described in detail with reference to FIG. 9 and detailed descriptions of the other stages will be omitted in order to avoid redundancy.

Referring to FIG. 9, each stage includes a pull-up part 211, a carry part 212, a pull-down part 213, a pull-up driving part 214, a ripple preventing part 215a, a holding part 216, an inverter 217, a reset part 218, and a fourth floating preventing part 219d.

The pull-down part 213 includes a pull-down transistor NT3 having a control electrode connected to the second input terminal IN2, an input electrode connected to the first voltage input terminal Vin−1, and an output electrode connected to the output terminal OUT. Responsive to the next gate voltage from the next stage, the pull-down transistor NT3 pulls down a present gate voltage, which is at a first clock CKV, to the first source power voltage VSS1 (shown in FIG. 8) that is supplied through the first voltage input terminal Vin−1. That is, the pull-down transistor NT3 is turned on after the first period (1 H period), in which the present gate voltage is generated in a high state within one frame, to pull down the present gate voltage to a low state.

The pull-up driving part 214 includes a buffer transistor NT4, a first capacitor C1, a second capacitor C2, and a discharge transistor NT5. The discharge transistor NT5 includes an input electrode connected to an output electrode of the butter transistor NT4, a control electrode connected to the second input terminal IN2, and an output electrode connected to the first voltage input terminal Vin-1.

When the discharge transistor NT5 is turned on in response to the next gate voltage from the next stage, a charge that is charged in the first capacitor C1 is discharged to the first source power voltage VSS1 through the discharge transistor NT5. Thus, an electric potential of a Q-node QN is lowered to the first source power voltage VSS1, so that the pull-up transistor NT1 and the carry transistor NT2 are turned off.

The ripple preventing part 215a includes a first ripple preventing transistor NT6, a second ripple preventing transistor NT7, and a third ripple preventing transistor NT8. The ripple preventing part 215a prevents the present gate voltage and a present carry voltage from being rippled by the first clock CKV or a second clock CKVB during a remaining second period (that is, a (n-1)H period) except the first period within one frame.

The first ripple preventing transistor NT6 includes a control electrode connected to the first clock terminal CK1, an input electrode connected to the output terminal OUT, and an output electrode connected to the Q-node QN. The second ripple preventing transistor NT7 includes a control electrode connected to the second clock terminal CK2, an input electrode connected to the output terminal OUT, and an output electrode connected to the first voltage input terminal Vin-1. The third ripple preventing transistor NT8 includes a control electrode connected to the second clock terminal CK2, an input electrode connected to the first input terminal IN1, and an output electrode connected to the Q-node QN.

The holding part 216 includes a holding transistor NT9 having a control electrode connected to an output terminal of the inverter 217, an input electrode connected to the first voltage input terminal Vin-1, and an output electrode connected to the output terminal OUT.

The inverter 217 includes a first inverter transistor NT10, a second inverter transistor NT11, a third inverter transistor NT12, a fourth inverter transistor NT13, a third capacitor C3, and a fourth capacitor C4 in order to turn the holding transistor NT9 on or off.

The first inverter transistor NT10 includes an input electrode and a control electrode commonly connected to the first clock terminal CK1 and an output electrode connected to an output electrode of the second inverter transistor NT11 through the fourth capacitor C4. The second inverter transistor NT11 includes an input electrode connected to the first clock terminal CK1, a control electrode connected to the input electrode thereof through the third capacitor C3, and an output electrode connected to the control electrode of the holding transistor NT9. The third inverter transistor NT12 includes an input electrode connected to the output electrode of the first inverter transistor NT10, a control electrode connected to the output terminal OUT, and an output electrode connected to the first voltage input terminal Vin-1. The fourth inverter transistor NT13 includes an input electrode connected to the control electrode of the holding transistor NT9, a control electrode connected to the output terminal OUT, and an output electrode connected to the first voltage input terminal Vin-1.

The third inverter transistor NT12 and the fourth inverter transistor NT13 are turned on in response to a high present gate voltage, and the first clock CKV output from the first inverter transistor NT10 and the second inverter transistor NT11 is discharged to the first source power voltage VSS1. Thus, the holding transistor NT9 is turned off during the first period where the present gate voltage is maintained at the high state. When the present gate voltage transitions to the low state, the third inverter transistor NT12 and the fourth inverter transistor NT13 are turned off. Thus, the holding transistor NT9 is turned on in response to the first clock CKV output from the first and the second inverter transistors NT10 and NT11. Consequently, the holding transistor NT9 may hold the present gate voltage at the first source power voltage VSS1 during the high period of the first clock CKV within the second period.

The reset part 218 includes a reset transistor NT14 having a control electrode connected to the reset terminal RE, an input electrode connected to a control electrode of the pull-up transistor NT1, and an output electrode connected to the first voltage input terminal Vin-1. The reset transistor NT14 discharges noise input through the first input terminal IN1 to the first source power voltage VSS1 in response to the last carry voltage from the last stage SRCn+1 (shown in FIG. 8) input through the reset terminal RE.

The fourth floating preventing part 219d includes a fourth floating preventing transistor NT19 having a control electrode connected to the output terminal of the inverter 217, an input electrode connected to the second voltage input terminal Vin-2, and an output electrode connected to a present carry node CN. The fourth floating preventing transistor NT19 is turned on or turned off in response to the output signal of the inverter 217. Specifically, the fourth floating preventing transistor NT19 is turned off in response to a low output signal of the inverter 217 during the first period. Then, the fourth floating preventing transistor NT19 is turned on in response to a high output signal of the inverter 217 during the high period of the first clock CKV within the second period. The turned-on fourth floating preventing transistor NT19 outputs the second source power voltage VSS2 applied through the second voltage input terminal Vin-2 to the present carry node CN. Thus, the fourth floating preventing transistor NT19 resets an electric potential of the present carry node CN to the level of the second source power voltage VSS2 during the high period of the first clock CKV within the second period.

As shown in FIG. 8, the present carry node CN is connected to a first input terminal IN1 of a next stage. Thus, a carry voltage having a same voltage level as the level of the second source power voltage VSS2 is applied to the first input terminal IN1 of the next stage during the high period of the first clock CKV within the second period. Consequently, an electric potential of the Q-node QN of the next stage may be maintained at the level of the second source power voltage VSS2 during the high period of the first clock CKV within the second period. Accordingly, the fourth floating preventing transistor NT19 of the present stage may prevent the Q-node QN of the next stage from being floated.

Figure 10:
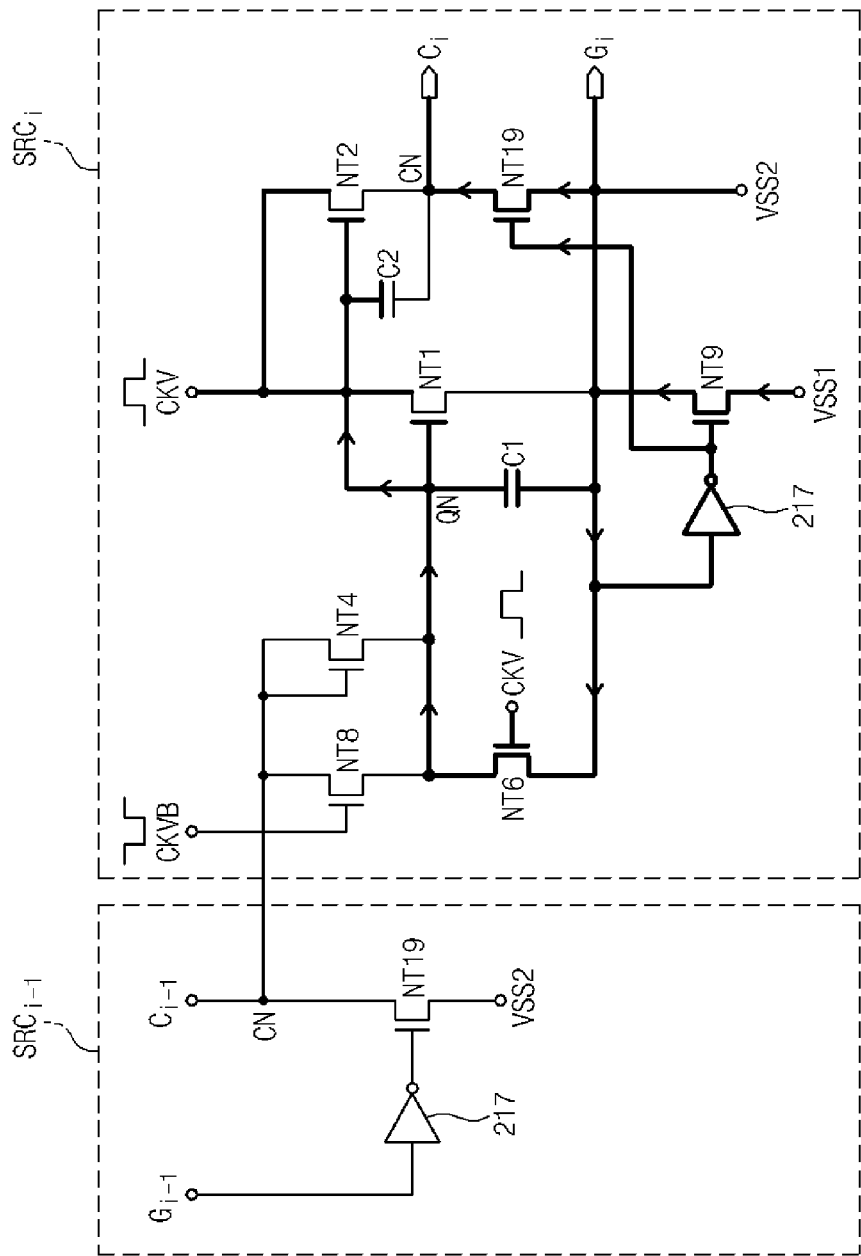
FIG. 10 is a circuit diagram showing an electric potential of a Q-node during a high period of a first clock.
Figure 11:
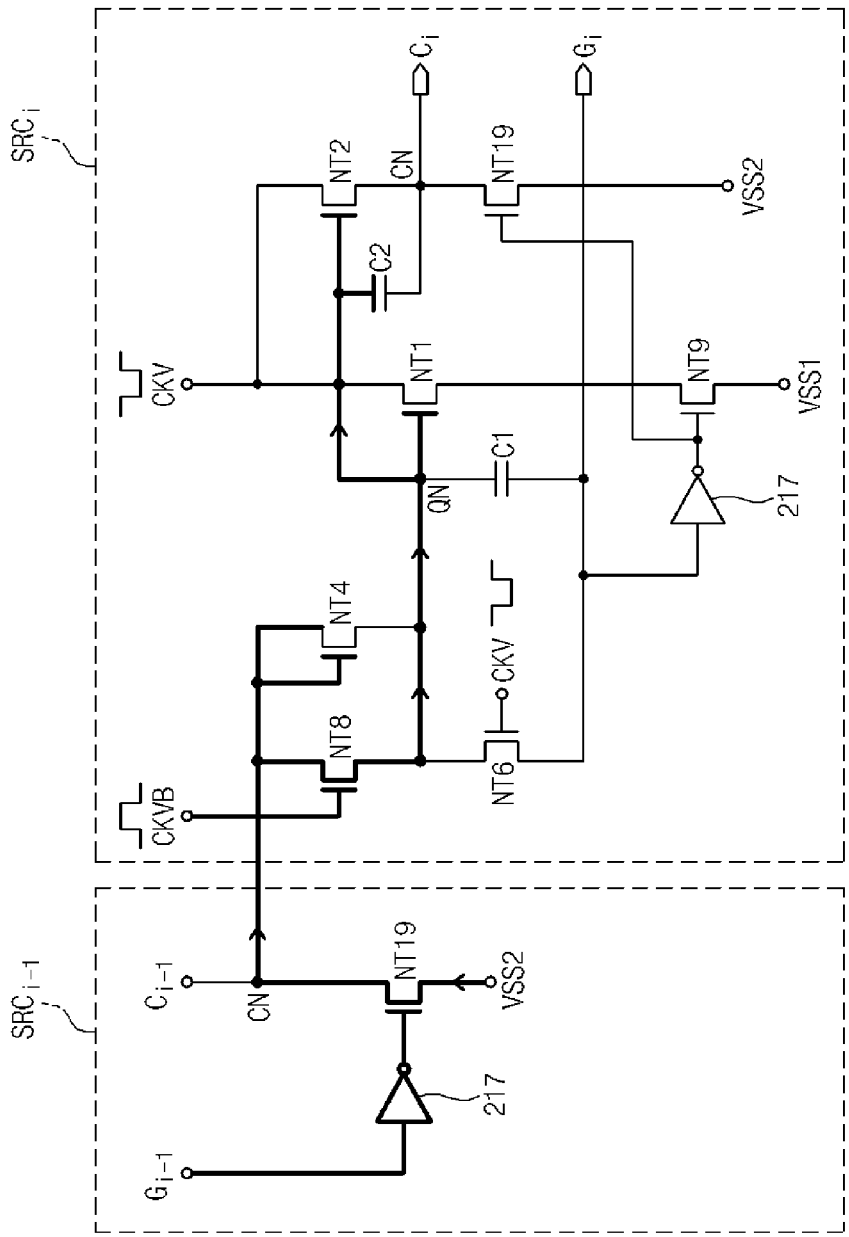
FIG. 11 is a circuit diagram showing an electric potential of a Q-node during a high period of a second clock.

FIG. 10 is a circuit diagram showing the electric potential of the Q-node during the high period of the first clock CKV within the second period, and FIG. 11 is a circuit diagram showing the electric potential of the Q-node during the high period of the second clock CKVB within the second period. In FIG. 10 and FIG. 11, a circuit of an i-th stage among the stages of the shift register ("i" is an odd number that is larger than 1 and smaller than n) will be partially shown.

Referring to FIG. 10, the holding transistor NT9 and the first ripple preventing transistor NT6 are turned on in order to hold the electric potential of the Q-node QN at the level of the first source power voltage VSS1 during the high period of the first clock CKV within the second period where an i-th gate voltage Gi is maintained at the low state (that is, the level of the first source power voltage VSS1).

Specifically, the inverter 217 outputs a high output signal in response to the first clock CKV to turn on the holding transistor NT9 to output the first source power voltage VSS1. Since the first ripple preventing transistor NT6 is previously turned on in response to the first clock CKV, the first source power voltage VSS1 output from the holding transistor NT9 is applied to the Q-node QN through the first ripple preventing transistor NT6. Thus, the electric potential of the Q-node QN is maintained at the level of the first source power voltage VSS1, and the pull-up transistor NT1 and the carry transistor NT2 connected to the Q-node QN are turned off. As a result, the i-th gate voltage Gi and an i-th carry voltage Ci may be prevented from being rippled during the high period of the first clock CKV within the second period.

The first source power voltage VSS1 output from the holding transistor NT9 is also output to the output terminal OUT of the i-th stage SRCi, so that the i-th gate voltage Gi is maintained at the level of the first source power voltage VSS1.

Since the fourth floating preventing transistor NT19 is turned on in response to the high output signal from the inverter 217, the electric potential of the carry node CN of the i-th stage SRCi is maintained at the level of the second source power voltage VSS2. The i-th carry voltage Ci having the level of the second source power voltage VSS2 is output from the i-th stage SRCi and applied to the first input terminal IN1 of an (i+1)th stage (not shown).

Referring to FIG. 11, the third ripple preventing transistor NT8 is turned on in order to hold the electric potential of the Q-node QN at the level of the second source power voltage VSS2 during the high period of the second clock CKVB within the second period where the i-th gate voltage Gi is maintained at the low state (that is, the level of the first source power voltage VSS1).

The input electrode of the third ripple preventing transistor NT8 of the i-th stage SRCi is connected to the carry node CN of the (i−1)th stage SRCi−1, and the carry node CN of the (i−1)th stage SRCi−1 is maintained at the level of the second source power voltage VSS2 by the fourth floating preventing transistor NT19 of the (i−1)th stage SRCi−1. Thus, an (i−1)th carry voltage Ci−1 having the level of the second source power voltage VSS2 is applied to the input electrode of the third ripple preventing transistor NT8 of the i-th stage SRCi. The (i−1)th carry voltage Ci−1 is applied to the Q-node QN of the i-th stage SRCi through the third ripple preventing transistor NT8.

Consequently, the electric potential of the Q-node QN of the i-th stage SRCi is maintained at the level of the second source power voltage VSS2, and the pull-up transistor NT1 and the carry transistor NT2 connected to the Q-node QN are turned off. Accordingly, the i-th gate voltage Gi and the i-th carry voltage Ci may be prevented from being rippled during the high period of the second clock CKVB within the second period.

Figure 12:
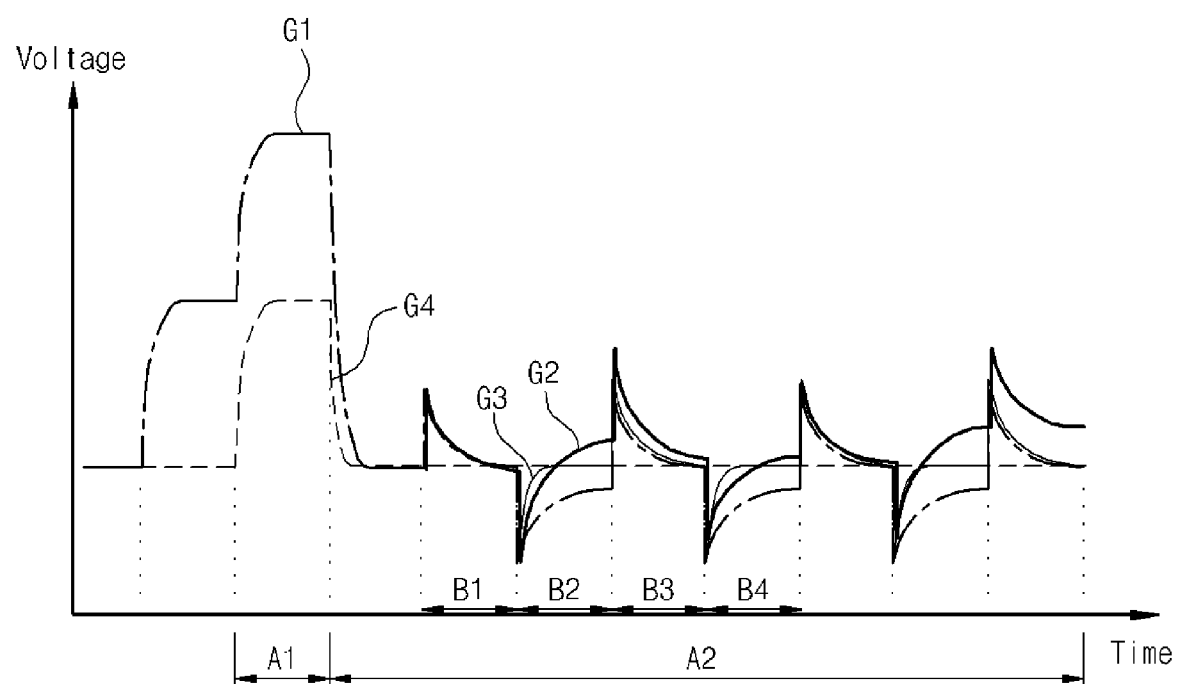
FIG. 12 is a graph showing an electric potential of a Q-node as a function of a time.

FIG. 12 is a graph showing the electric potential of the Q-node QN as a function of a time. In FIG. 12, the first graph G1 represents the electric potential of the Q-node QN in a case where the stage does not include the fourth floating preventing transistor NT19, the second graph G2 represents the electric potential of the Q-node QN in a case where the present gate signal is applied to the fourth floating preventing transistor NT19, the third graph G3 represents the electric potential of the Q-node in a case where the second source power voltage VSS2 is applied to the fourth floating preventing transistor NT19, and the fourth graph G4 represents the present gate voltage.

Referring to FIG. 12, according to the first graph G1 and the fourth graph G4, the present gate voltage is maintained at an on-state during the first period A1 where the electric potential of the Q-node QN (shown in FIG. 10 and FIG. 11) is boosted up. Then, the present gate voltage is maintained at an off-state during the second period A2.

In the case where the stage does not include the fourth floating preventing transistor NT19 as shown by the first graph G1, the ripple occurs at the Q-node QN during the high periods B1 and B3 of the first clock CKV (shown in FIG. 10) and the high periods B2 and B4 of the second clock CKVB (shown in FIG. 11) under a high temperature condition. Specifically, the previous carry node CN is floated during the high periods B2 and B4 of the second clock CKVB when the fourth floating preventing transistor NT19 is not included in the stage. Thus, the electric potential of the Q-node QN is unstable during the high periods B2 and B4 of the second clock CKVB.

However, in the case where the present gate signal is applied to the fourth floating preventing transistor NT19 as shown by the second graph G2, the size of the ripple of the Q-node QN during the high periods B2 and B4 of the second clock CKVB under the high temperature condition becomes smaller than the size of the ripple in the case where the fourth floating preventing transistor NT19 is not included in the stage. Specifically, the present gate signal lowered to the first source power voltage VSS1 of about −6.7 V is applied to the previous carry node CN by the fourth floating preventing transistor NT19 during the high periods B2 and B4 of the second clock CKVB under the high temperature condition. Thus, the size of ripple of the Q-node QN may be reduced.

In the case where the second source power voltage VSS2 of about −13V is applied to the fourth floating preventing transistor NT19 as shown by the third graph G3, the size of the ripple of the Q-node QN during the high periods B2 and B4 of the second clock CKVB under the high temperature condition becomes smaller than the size of the ripples in the two former cases. That is, the second source power voltage VSS2, which is lower than the first source power voltage VSS1, is applied to the previous carry node CN by the fourth floating preventing transistor NT19 during the high periods B2 and B4 of the second clock CKVB. Thus, the electric potential of the Q-node QN becomes more stable, thereby reducing the size of ripple of the Q-node QN.

Figure 13:
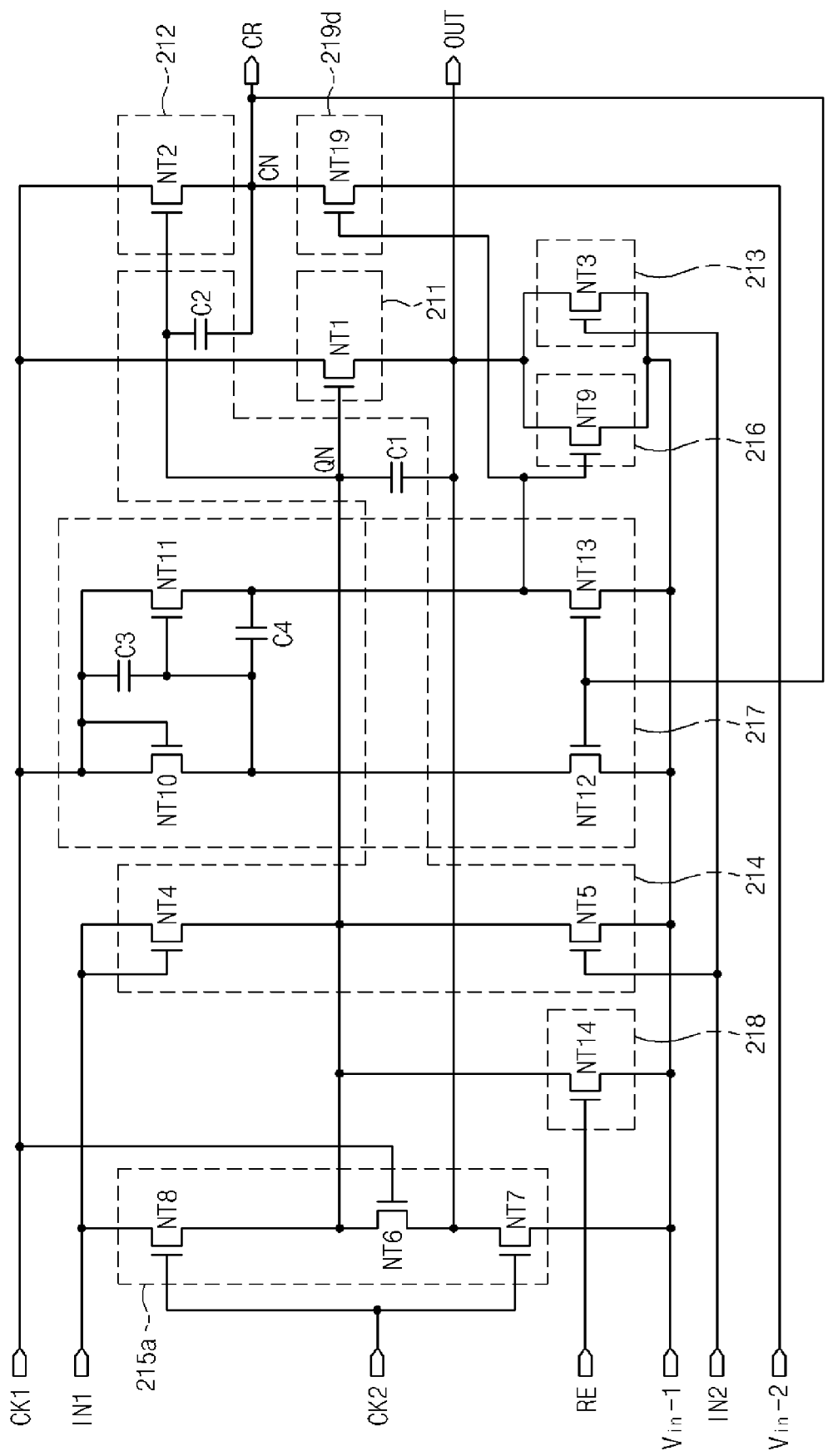
FIG. 13 is a circuit diagram showing each stage of a gate driving circuit according to another exemplary embodiment of the present invention.

FIG. 13 is a circuit diagram of a stage of a gate driving circuit according to another exemplary embodiment of the present invention. In FIG. 13, the same reference numerals denote the same elements as in FIG. 9, and thus the detailed description of the same elements will be omitted.

Referring to FIG. 13, each stage includes a pull-up part 211, a carry part 212, a pull-down part 213, a pull-up driving part 214, a ripple preventing part 215a, a holding part 216, an inverter 217, a reset part 218, and a fourth floating preventing part 219d.

The inverter 217 includes a first inverter transistor NT10, a second inverter transistor NT11, a third inverter transistor NT12, a fourth inverter transistor NT13, a third capacitor C3, and a fourth capacitor C4 in order to turn a holding transistor NT9 of the holding part 216 on or off.

The first inverter transistor NT10 includes an input electrode and a control electrode commonly connected to a first clock terminal CK1 and an output electrode connected to an output electrode of the second inverter transistor NT11 through the fourth capacitor C4. The second inverter transistor NT11 includes an input electrode connected to the first clock terminal CK1, a control electrode connected to the input electrode thereof through the third capacitor C3, and an output electrode connected to a control electrode of the holding transistor NT9. The third inverter transistor NT12 includes an input electrode connected to the output electrode of the first inverter transistor NT10, a control electrode connected to a carry terminal CR, and an output electrode connected to a first voltage input terminal Vin−1. The fourth inverter transistor NT13 includes an input electrode connected to the control electrode of the holding transistor NT9, a control electrode connected to the carry terminal CR, and an output electrode connected to the first voltage input terminal Vin−1.

The third and fourth inverter transistors NT12 and NT13 are turned on in response to the present gate voltage at the high state output to the carry terminal CR, and the first clock CKV output from the first and second inverter transistors NT10 and NT11 is discharged to the first source power voltage VSS1 through the third and fourth inverter transistors NT12 and NT13 that are turned on. Thus, the holding transistor NT9 is maintained at a turn-off state during the first period where the present gate voltage is maintained at the high state.

Then, the present carry voltage is lowered to the second source power voltage VSS2 by the fourth floating preventing transistor NT19 during the second period, and the third and fourth inverter transistors NT12 and NT13 are turned off. Thus, the first clock CKV output from the first and second inverter transistors NT10 and NT11 is not discharged through the third and fourth inverter transistors NT12 and NT13, but applied to the control electrode of the holding transistor NT9 to turn on the holding transistor NT9. Consequently, the holding transistor NT9 may hold the present gate voltage at the first source power voltage VSS1 during the high period of the first clock CKV within the second period.

The fourth floating preventing transistor NT19 of the fourth floating preventing part 219d includes a control electrode connected to the output terminal of the inverter 217, an input electrode connected to the second voltage input terminal Vin−2, and an output electrode connected to the present carry node CN. The fourth floating preventing transistor NT19 is turned on or turned off in response to the output signal of the inverter 217. Specifically, the fourth floating preventing transistor NT19 is turned off in response to a low output signal of the inverter 217 during the first period. Then, the fourth floating preventing transistor NT19 is turned on in response to a high output signal of the inverter 217 during the high period of the first clock CKV within the second period. The turned-on fourth floating preventing transistor NT19 outputs the second source power voltage VSS2 applied through the second voltage input terminal Vin−2 to the present carry node CN. Thus, the fourth floating preventing transistor NT19 resets the electric potential of the present carry node CN to the level of the second source power voltage VSS2 during the high period of the first clock CKV within the second period.

As described above, the present carry node CN is connected to the control electrodes of the third and fourth inverter transistors NT12 and NT13 of the inverter 217. Thus, the present carry voltage lowered to the second source power voltage VSS2 is applied to the control electrodes of the third and fourth inverter transistors NT12 and NT13 through the fourth floating preventing transistor NT19 during the second period. As a result, the third and fourth inverter transistors NT12 and NT13 may be stably turned off by the present carry voltage that is lowered to the second source power voltage VSS2 and the holding transistor NT9 may be stably turned on, thereby preventing the present gate voltage from being floated.

Figure 14:
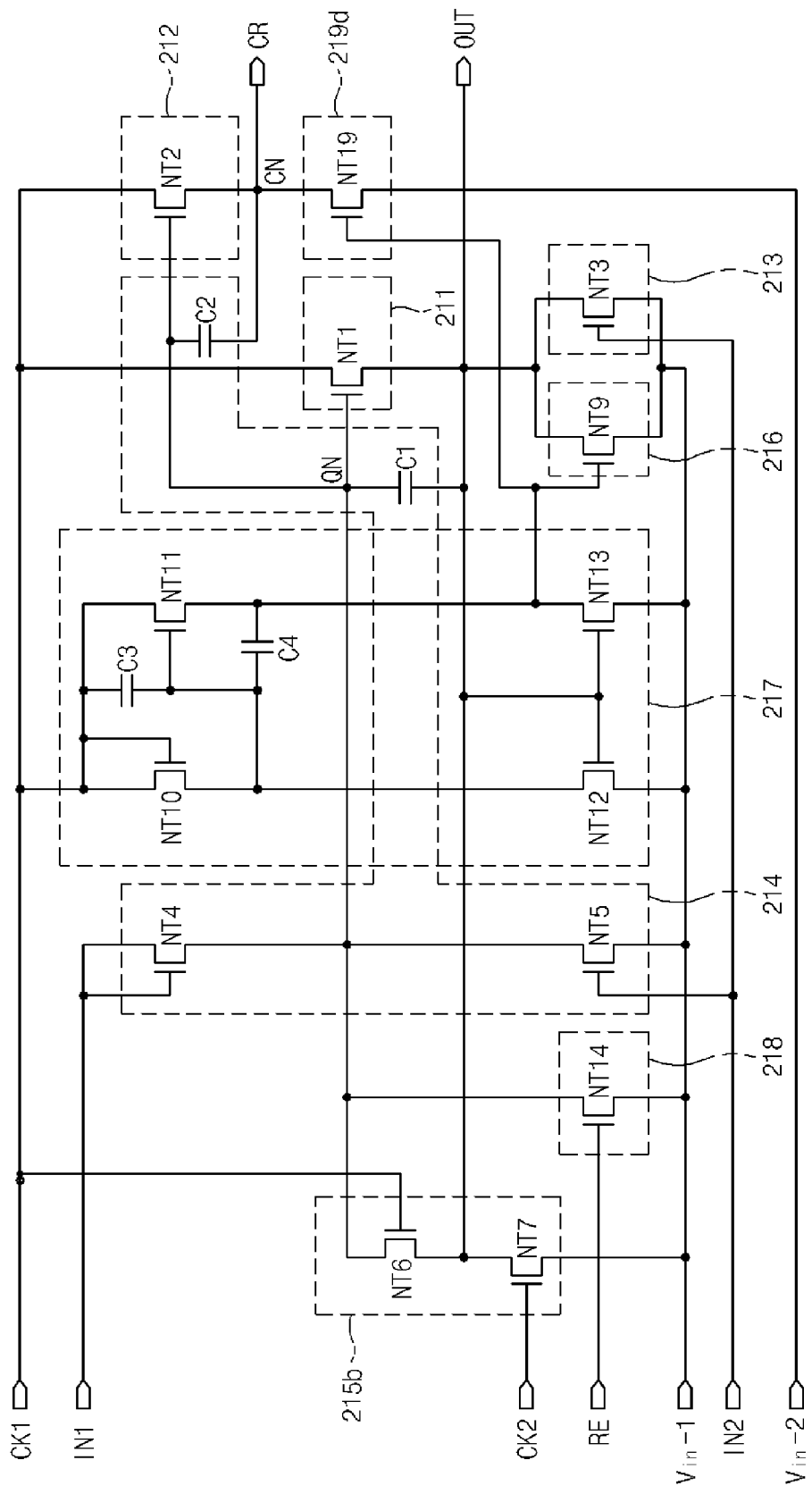
FIG. 14 is a circuit diagram showing each stage of a gate driving circuit according to another exemplary embodiment of the present invention.

FIG. 14 is a circuit diagram showing a stage of a gate driving circuit according to another exemplary embodiment of the present invention. In FIG. 14, the same reference numerals denote the same elements as in FIG. 9, and thus the detailed description of the same elements will be omitted.

Referring to FIG. 14, each stage includes a pull-up part 211, a carry part 212, a pull-down part 213, a pull-up driving part 214, a ripple preventing part 215b, a holding part 216, an inverter 217, a reset part 218, and a fourth floating preventing part 219d.

The ripple preventing part 215b includes a first ripple preventing transistor NT6 and a second ripple preventing transistor NT7. The ripple preventing part 215b does not include the third ripple preventing transistor NT8, unlike the ripple preventing part 215a as shown in FIG. 9. That is, an electric potential of a previous carry node CN is stably lowered to a second source power voltage VSS2 applied through the fourth floating preventing transistor NT19 during the high period of the second clock CKVB. Since the electric potential of the Q-node QN of the present stage becomes more stable by the fourth floating preventing transistor NT19, the third ripple preventing transistor NT8 may be removed from the ripple preventing part 215b. Thus, the space of each stage may be reduced by the size of the third ripple preventing transistor NT8.

Figure 15:
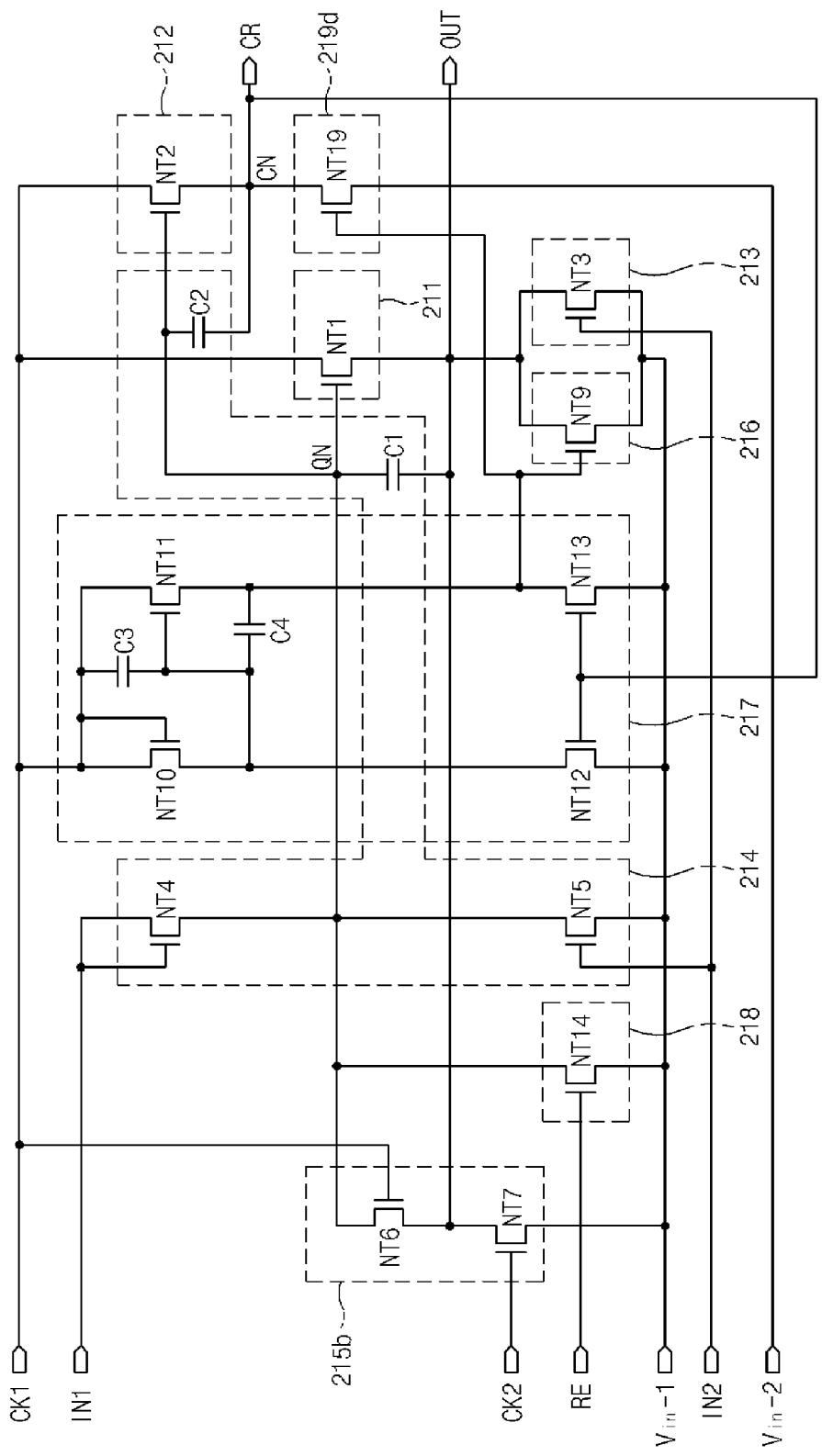
FIG. 15 is a circuit diagram showing each stage of a gate driving circuit according to another exemplary embodiment of the present invention.

FIG. 15 is a circuit diagram showing a stage of a gate driving circuit according to another exemplary embodiment of the present invention. In FIG. 15, the same reference numerals denote the same elements as in FIG. 13, and thus the detailed description of the same elements will be omitted.

Referring to FIG. 15, control electrodes of a third inverter transistor NT12 and a fourth inverter transistor NT13 are connected to a carry node CN of a present stage. Therefore, the third and fourth inverter transistors NT12 and NT13 are controlled by a present carry voltage output through the carry node CN.

In the gate driving circuit, a ripple preventing part 215b includes a first ripple preventing transistor NT6 and a second ripple preventing transistor NT7. The ripple preventing part 215b does not include a third ripple preventing transistor NT8, unlike the ripple preventing part 215a as shown in FIG. 13. In the present exemplary embodiment, an electric potential of a previous carry node CN is stably lowered to the second source power voltage VSS2 by a fourth floating preventing transistor NT19 during a high period of a second clock CKVB. Thus, the third ripple preventing transistor NT8 may be removed from the ripple preventing part 215b since an electric potential of the Q-node QN of the present stage becomes more stable by the fourth floating preventing transistor NT19. Thus, the space of each stage may be reduced by the size of the third ripple preventing transistor NT8.

According to the gate driving circuit and the display apparatus, when the carry node of the present stage is connected to the Q-node of the next stage, each stage of the gate driving circuit includes the floating preventing transistor that resets the electric potential of the carry node of the present stage to the present gate voltage that is maintained at the first source power voltage or to the second source power voltage, which is lower than the first source power voltage, during the second period.

Thus, the gate driving circuit may prevent occurrence of ripple on the Q-node of the next stage during the second period within one frame, thereby preventing the drive malfunction caused by noise during a high-temperature test and improving the high-temperature reliability of the gate driving circuit.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A gate driving circuit comprising n+1 stages connected to each other in series (n is a constant number larger than 2), each stage comprising:
a pull-up part to pull up a present gate signal to a first clock during a first period within one frame and to output the present gate signal to an output terminal;
a carry part to pull up a present carry signal to the first clock during the first period and to output the present carry signal to a carry terminal;
a pull-down part to receive a next gate signal from a next stage to discharge the present gate signal to a source power voltage;
a pull-up driving part to receive a previous carry signal from a previous stage to turn on the pull-up part and the carry part, and to turn off the pull-up part and the carry part in response to the next gate signal, the pull-up driving part being connected to a Q-node comprising a control terminal of the carry part and a control terminal of the pull-up part;
a holding part to maintain the present gate signal at the source power voltage;
a first floating preventing part connected between the output terminal of the pull-up part and the carry terminal of the carry part; and
an inverter to turn the holding part and the first floating preventing part on or off in response to the first clock; and
wherein the first floating preventing part resets the carry terminal of the carry part in response to an output signal from the inverter during a second period within the one frame to prevent a Q-node of the next stage from being floated, and the second period does not include the first period.

2. The gate driving circuit of claim 1, wherein the first floating preventing part comprises a floating preventing transistor comprising a control electrode connected to an output terminal of the inverter, an input electrode connected to the output terminal of the pull-up part, and an output electrode connected to the carry terminal of the carry part.

3. The gate driving circuit of claim 1, wherein the holding part comprises a holding transistor comprising a control electrode connected to an output terminal of the inverter, an input electrode to receive the source power voltage, and an output electrode connected to an output terminal of the pull-up part.

4. The gate driving circuit of claim 1, wherein each stage further comprises a second floating preventing part to reset the previous carry signal to the source power voltage in response to the first clock to prevent a previous carry node from being floated.

5. The gate driving circuit of claim 4, wherein the second floating preventing part comprises a floating preventing transistor comprising a control electrode to which the first clock is applied, an input electrode to which the source power voltage is applied, and an output electrode connected to the previous carry node.

6. The gate driving circuit of claim 1, wherein each stage further comprises a ripple preventing part to prevent the Q-node from being rippled during the second period.

7. The gate driving circuit of claim 6, wherein the ripple preventing part comprises:
a first ripple preventing transistor comprising a control electrode to receive the first clock, an input electrode connected to an output terminal of the pull-up part, and an output electrode connected to the Q-node;
a second ripple preventing transistor comprising a control electrode to receive a second clock, an input electrode connected to the output terminal of the pull-up part, and an output electrode connected to a voltage input terminal to which the source power voltage is applied; and
a third ripple preventing transistor comprising a control electrode to receive the second clock, an input electrode connected to a previous carry terminal to receive the previous carry signal, and an output electrode connected to the Q-node,
wherein a phase of the second clock is opposite to a phase of the first clock.

8. The gate driving circuit of claim 1, wherein:
the pull-up part comprises a pull-up transistor comprising a control electrode connected to the Q-node, an input electrode to receive the first clock, and an output electrode to output the present gate signal, and
the carry part comprises a carry transistor comprising a control electrode connected to the Q-node, an input electrode to receive the first clock, and an output electrode to output the present carry signal.

9. The gate driving circuit of claim 8, wherein the pull-up driving part comprises:
a buffer transistor comprising a control electrode and an input electrode to commonly receive the previous carry signal, and an output electrode connected to the Q-node;
a first capacitor connected between the control electrode and the output electrode of the pull-up transistor;
a second capacitor connected between the control electrode and the output electrode of the carry transistor; and
a discharge transistor comprising a control electrode to receive the next gate signal, an input electrode connected to the output electrode of the buffer transistor, and an output electrode connected to a voltage input terminal to which the source power voltage is applied.

10. A display apparatus, comprising:
a display part to display an image in response to a gate signal and a data signal;
a data driving circuit to provide the data signal to the display part; and
a gate driving circuit comprising n+1 stages connected to each other in series to sequentially output the gate signal to the display part(n is a constant number larger than 2), each stage of the gate driving circuit comprising:
a pull-up part to pull up a present gate signal to a first clock during a first period within one frame and to output the present gate signal to an output terminal;
a carry part to pull up a present carry signal to the first clock during the first period and to output the present carry signal to a carry terminal;
a pull-down part to receive a next gate signal from a next stage to discharge the present gate signal to a source power voltage;
a pull-up driving part to receive a previous carry signal from a previous stage to turn on the pull-up part and the carry part, and to turn off the pull-up part and the carry part in response to the next gate signal, the pull-up driving part being connected to a Q-node comprising a control terminal of the carry part and a control terminal of the pull-up part;
a holding part to maintain the present gate signal at the source power voltage;
a first floating preventing part connected between the output terminal of the pull-up part and the carry terminal of the carry part; and an inverter to turn the holding part and the first floating preventing part on or off in response to the first clock, wherein the first floating preventing part resets the carry terminal of the carry part in response to an output signal from the inverter during a second period within the one frame to prevent a Q-node of the next stage from being floated, and the second period does not include the first period.

11. The display apparatus of claim 10, wherein the first floating preventing part comprises a floating preventing transistor comprising a control electrode connected to an output terminal of the inverter, an input electrode connected to the output terminal of the pull-up part, and an output electrode connected to the carry terminal.

12. The display apparatus of claim 10, wherein each stage further comprises a second floating preventing part to reset the previous carry signal to the source power voltage in response to the first clock to prevent a previous carry node from being floated.

13. The display apparatus of claim 12, wherein the second floating preventing part comprises a floating preventing transistor comprising a control electrode to which the first clock is applied, an input electrode to which the source power voltage is applied, and an output electrode connected to the previous carry node.

14. The display apparatus of claim 10, wherein the display part comprises:
    a plurality of gate lines to sequentially receive the gate signal;
    a plurality of data lines to receive the data signal;
    a thin film transistor to output the data signal in response to the gate signal; and
    a liquid crystal capacitor comprising a pixel electrode that receives the data signal and a common electrode that receives a common voltage and faces the pixel electrode.

15. The display apparatus of claim 14, wherein the display part further comprises an array substrate on which the gate lines, the data lines, the thin film transistor, and the pixel electrode are arranged, the gate driving circuit being arranged on the array substrate.

* * * * *